United States Patent
Hanson et al.

(10) Patent No.: US 8,674,288 B2
(45) Date of Patent: Mar. 18, 2014

(54) MOTOR ASSEMBLY SENSOR CAPTURE SYSTEMS AND METHODS

(75) Inventors: Ian B. Hanson, Granada Hills, CA (US); Paul F. Bente, IV, South Pasadena, CA (US); Jacques L. Favreau, Pasadena, CA (US); Lothar Westerweck, Alameda, CA (US)

(73) Assignee: Medtronic MiniMed, Inc., Northridge, CA (US)

( * ) Notice: Subject to any disclaimer, the term of this patent is extended or adjusted under 35 U.S.C. 154(b) by 351 days.

(21) Appl. No.: 13/049,803

(22) Filed: Mar. 16, 2011

(65) Prior Publication Data

US 2011/0233393 A1    Sep. 29, 2011

Related U.S. Application Data

(60) Provisional application No. 61/317,200, filed on Mar. 24, 2010.

(51) Int. Cl.
  *G01D 5/34* (2006.01)
  *G01D 5/36* (2006.01)
  *G01B 11/14* (2006.01)
  *H03M 1/22* (2006.01)

(52) U.S. Cl.
  USPC ............... 250/231.17; 250/231.18; 250/233; 356/616; 341/11

(58) Field of Classification Search
  USPC ............... 250/231.13–231.18, 233, 236, 239; 341/11, 13, 31; 356/616, 617
  See application file for complete search history.

(56) References Cited

U.S. PATENT DOCUMENTS

| | | | |
|---|---|---|---|
| 6,483,105 B2 * | 11/2002 | McAllister et al. | ...... 250/231.13 |
| 2004/0212261 A1 | 10/2004 | Uchiyama | |
| 2007/0066938 A1 | 3/2007 | Iio et al. | |
| 2008/0051710 A1 | 2/2008 | Moberg et al. | |

FOREIGN PATENT DOCUMENTS

WO    WO-2008/139459    11/2008

OTHER PUBLICATIONS

PCT International Search Report for PCT/US2011/029672 filed Mar. 23, 2011. IRS mailing date Mar. 23, 2012.

* cited by examiner

*Primary Examiner* — Kevin Pyo
*Assistant Examiner* — Don Williams
(74) *Attorney, Agent, or Firm* — Foley & Lardner LLP

(57) ABSTRACT

A motor may be configured to drive a drive shaft and an engagement member supported on the drive shaft. A detectable feature comprising a rotary member may be supported on the drive shaft such that movement of the drive shaft by the motor changes a state of the detectable feature. At least one sensor may be arranged to detect the state of the detectable feature. Circuitry may be configured to provide a signal in response to a change in the state of the detectable feature detected by the at least one sensor.

23 Claims, 16 Drawing Sheets

MOTOR ASSEMBLY SENSOR CAPTURE SYSTEMS AND METHODS

CROSS-REFERENCE TO RELATED PATENT APPLICATIONS

This application claims priority from Provisional application U.S. Application 61/317,200, filed Mar. 24, 2010, incorporated herein by reference in its entirety.

BACKGROUND

1. Field of the Invention

Embodiments of the present invention generally relate to encoder sensor systems and methods, and, in specific embodiments, to encoder sensor systems and methods for a motor assembly.

2. Related Art

According to modern medical techniques, certain chronic diseases may be treated by delivering a medication or other substance to the body of a patient. For example, diabetes is a chronic disease that is commonly treated by delivering defined amounts of insulin to a patient at appropriate times. Traditionally, manually operated syringes and insulin pens have been employed for delivering insulin to a patient. More recently, modern systems have been designed to include programmable pumps for delivering controlled amounts of medication to a patient.

Pump type delivery devices have been configured in external devices, which connect to a patient, and have been configured in implantable devices, which are implanted inside of the body of a patient. External pump type delivery devices include devices designed for use in a stationary location, such as a hospital, a clinic, or the like, and further include devices configured for ambulatory or portable use, such as devices designed to be carried by a patient, or the like. External pump-type delivery devices may contain reservoirs of fluidic media, such as, but is not limited to, insulin.

External pump-type delivery devices may be connected in fluid flow communication to a patient or user-patient, for example, through suitable hollow tubing. The hollow tubing may be connected to a hollow needle that is designed to pierce the skin of the patient and to deliver fluidic media there through. Alternatively, the hollow tubing may be connected directly to the patient as through a cannula, or the like.

Examples of some external pump type delivery devices are described in U.S. patent application Ser. No. 11/211,095, filed Aug. 23, 2005, titled "Infusion Device And Method With Disposable Portion" and Published PCT Application WO 01/70307 (PCT/US01/09139) titled "Exchangeable Electronic Cards For Infusion Devices" (each of which is owned by the assignee of the present invention), Published PCT Application WO 04/030716 (PCT/US2003/028769) titled "Components And Methods For Patient Infusion Device," Published PCT Application WO 04/030717 (PCT/US2003/029019) titled "Dispenser Components And Methods For Infusion Device," U.S. Patent Application Publication No. 2005/0065760 titled "Method For Advising Patients Concerning Doses Of Insulin," and U.S. Pat. No. 6,589,229 titled "Wearable Self-Contained Drug Infusion Device," each of which is incorporated herein by reference in its entirety.

External pump-type delivery devices may be connected in fluid-flow communication to a patient-user, for example, through suitable hollow tubing. The hollow tubing may be connected to a hollow needle that is designed to pierce the patient-user's skin and deliver an infusion medium to the patient-user. Alternatively, the hollow tubing may be connected directly to the patient-user as or through a cannula or set of micro-needles.

In contexts in which the hollow tubing is connected to the patient-user through a hollow needle that pierces skin of the user-patient, a manual insertion of the needle into the patient-user can be somewhat traumatic to the user-patient. Accordingly, insertion mechanisms have been made to assist the insertion of a needle into the user-patient, whereby a needle is forced by a spring to move quickly from a retracted position into an extended position. As the needle is moved into the extended position, the needle is quickly forced through the skin of the user-patient in a single, relatively abrupt motion that can be less traumatic to certain user-patients as compared to a slower, manual insertion of a needle. While a quick thrust of the needle into the skin of the user-patient may be less traumatic to some user-patients than a manual insertion, it is believed that, in some contexts, some user-patients may feel less trauma if the needle is moved a very slow, steady pace.

Examples of insertion mechanisms that may be used with and may be built into a delivery device are described in: U.S. patent application Ser. No. 11/645,435, filed Dec. 26, 2006, titled "Infusion Medium Delivery system, Device And Method With Needle Inserter And Needle Inserter Device And Method,"; and U.S. patent application Ser. No. 11/211,095, filed Aug. 23, 2005, titled "Infusion Device And Method With Disposable Portion" (each of which is assigned to the assignee of the present invention), each of which is incorporated herein by reference in its entirety. Other examples of insertion tools are described in U.S. Patent Application Publication No. 2002/0022855, titled "Insertion Device For An Insertion Set And Method Of Using The Same" (assigned to the assignee of the present invention), which is incorporated herein by reference in its entirety. Other examples of needle/cannula insertion tools that may be used (or modified for use) to insert a needle and/or cannula, are described in, for example U.S. patent application Ser. No. 10/389,132 filed Mar. 14, 2003, and entitled "Auto Insertion Device For Silhouette Or Similar Products," and/or U.S. patent application Ser. No. 10/314,653 filed Dec. 9, 2002, and entitled "Insertion Device For Insertion Set and Method of Using the Same," both of which are incorporated herein by reference in their entirety. Further examples of various insertion tools are described in, but are not limited to, U.S. patent application Ser. No. 11/645,972, filed Dec. 26, 2006, "Infusion Medium Delivery System, Device And Method With Needle Inserter And Needle Inserter Device And Method"; U.S. patent application Ser. No. 11/646,052, filed Dec. 26, 2006, "Infusion Medium Delivery System, Device And Method With Needle Inserter And Needle Inserter Device And Method"; U.S. patent application Ser. No. 11/646,000, filed Dec. 26, 2006, "Infusion Medium Delivery System, Device And Method With Needle Inserter And Needle Inserter Device And Method," all of which are herein incorporated by reference in their entirety.

Pump-type delivery devices can allow accurate doses of insulin to be calculated and delivered automatically to a patient-user at any time during the day or night. Furthermore, when used in conjunction with glucose sensors or monitors, insulin pumps may be automatically controlled to provide appropriate doses of infusion medium at appropriate times of need, based on sensed or monitored levels of blood glucose.

Pump-type delivery devices have become an important aspect of modern medical treatments of various types of medical conditions, such as diabetes. As pump technologies improve and as doctors and patient-users become more familiar with such devices, the popularity of external medical infusion pump treatment increases and is expected to increase substantially over the next decade.

SUMMARY OF THE DISCLOSURE

A sensor system may include, but is not limited to, a drive shaft, an engagement member, a motor, a detectable feature, at least one sensor, and circuitry. The engagement member may be supported on the drive shaft. The motor may be configured to drive the drive shaft and the engagement member supported on the drive shaft. The detectable feature may comprise a rotary member supported on the drive shaft such that movement of the drive shaft by the motor changes a state of the detectable feature. The least one sensor may be arranged to detect the state of the detectable feature. The circuitry may be configured to provide a signal in response to a change in the state of the detectable feature detected by the at least one sensor.

In various embodiments, the engagement member may comprise a gear. In various embodiments, each of the at least one sensor may have a slot. The rotary member may be arranged to rotate through the slot of each respective sensor. In some embodiments, the rotary member may be arranged to rotate through a center of the slot of each respective sensor.

In various embodiments, the rotary member may have a plurality of arms. Each of the arms may be separated by a gap. In various embodiments, the rotary member may have an arm extending therefrom. In various embodiments, the system may further include a housing for containing the at least one sensor and the rotary member. The housing may be configured to bias the at least one sensor against a surface of the housing to retain alignment of the at least one sensor relative to the drive shaft.

In various embodiments, the system may further include a housing for containing the at least one sensor and the rotary member. The housing may have at least one arm member configured to bias a respective sensor of the at least one sensor against a surface of the housing to retain alignment of the at least one sensor relative to the drive shaft.

In various embodiments, the system may further include a housing for containing the at least one sensor and the rotary member. The housing may have at least one seating surface for supporting a respective sensor of the at least one sensor. The housing may have at least one arm member configured to bias a respective sensor of the at least one sensor against the seating surface to retain alignment of the at least one sensor relative to the drive shaft.

In various embodiments, the system may further include a shield arranged relative to the at least one sensor to substantially prevent light from passing through the shield. In some embodiments, the shield may be made of a material comprising a metal foil material. In some embodiments, the system may further include a housing for containing the at least one sensor and rotary member. The shield may be configured to bias the circuitry against a surface of the housing.

In various embodiments, the system may further include a housing for containing the at least one sensor and the rotary member. The circuitry may comprise a flexible printed circuit board wrapped around at least a portion of the housing.

In various embodiments, the rotary member may be supported on the drive shaft opposite the engagement member with the motor therebetween. In some embodiments, the drive shaft may have a single, unitary body extending through the motor. In various embodiments, the at least one sensor may comprise two or more sensors. In some embodiments, each of the two or more sensors may be positioned around the axis of the drive shaft. In some embodiments, each of the two or more sensor is positioned relative to each other so that signals of each sensor are substantially perpendicular to each other.

In various embodiments, the system may further include a housing for containing the at least one sensor and the rotary member. The engagement member may be arranged to be external the housing. In various embodiments, each of the at least one sensor may comprise a photo interrupter sensor. In various embodiments, the detectable feature may be supported on one of the rotary member and the motor.

In various embodiments, the engagement member of the motor may be configured to be operatively engageable with a plunger arm connected to a plunger head arranged for movement by the motor in an axial direction of a reservoir. The motor may be configured to drive fluidic media from the reservoir upon the motor being operatively engaged with the reservoir and the plunger arm being moved in the axial direction relative to the reservoir.

A method of manufacturing a sensor system may include, but is not limited to, any one of or combination of: (i) providing a drive shaft; (ii) supporting an engagement member on the drive shaft; (iii) configuring a motor to drive the drive shaft and the engagement member supported on the drive shaft; (iv) providing a detectable feature comprising a rotary member supported on the drive shaft such that movement of the drive shaft by the motor changes a state of the detectable feature; (v) arranging at least one sensor to detect the state of the detectable feature; and (vi) configuring circuitry to provide a signal in response to a change in the state of the detectable feature detected by the at least one sensor.

DETAILED DESCRIPTION

Figure 1:
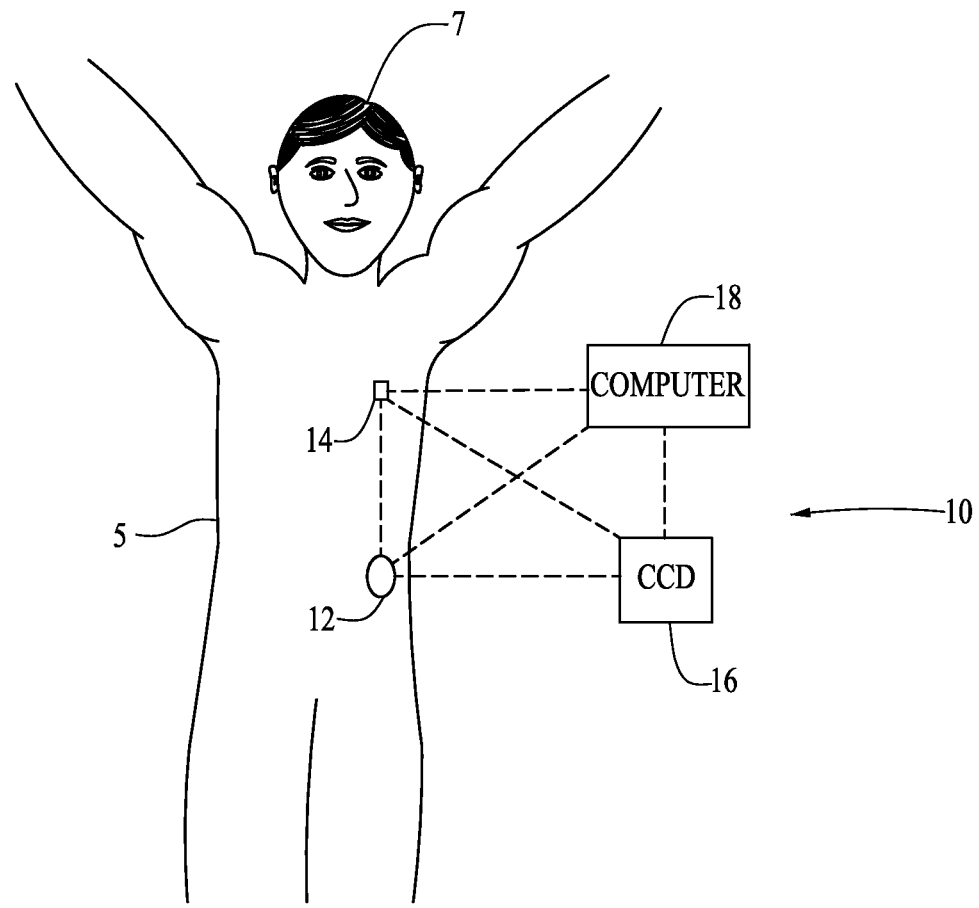
FIG. 1 illustrates a generalized representation of a system in accordance with an embodiment of the present invention.

FIG. 1 illustrates a generalized representation of a system 10 in accordance with an embodiment of the present invention. The system 10 may include a delivery device 12. The system 10 may further include a sensing device 14, a command control device (CCD) 16, and a computer 18. In various embodiments, the delivery device 12 and the sensing device 14 may be secured at desired locations on the body 5 of a patient or user-patient 7. The locations at which the delivery device 12 and the sensing device 14 are secured to the body 5 of the user-patient 7 in FIG. 1 are provided only as representative, non-limiting, examples.

The system 10, the delivery device 12, the sensing device 14, the CCD 16, and computer 18 may be similar to those described in the following U.S. patent applications that were assigned to the assignee of the present invention, where each of following patent applications is incorporated herein by reference in its entirety: (i) U.S. patent application Ser. No. 11/211,095, filed Aug. 23, 2005, "Infusion Device And Method With Disposable Portion"; (ii) U.S. patent application Ser. No. 11/515,225, filed Sep. 1, 2006, "Infusion Medium Delivery Device And Method With Drive Device For Driving Plunger In Reservoir"; (iii) U.S. patent application Ser. No. 11/588,875, filed Oct. 27, 2006, "Systems And Methods Allowing For Reservoir Filling And Infusion Medium Delivery"; (iv) U.S. patent application Ser. No. 11/588,832, filed Oct. 27, 2006, "Infusion Medium Delivery Device And Method With Drive Device For Driving Plunger In Reservoir"; (v) U.S. patent application Ser. No. 11/588,847, filed Oct. 27, 2006, "Infusion Medium Delivery Device And Method With Compressible Or Curved Reservoir Or Conduit"; (vi) U.S. patent application Ser. No. 11/589,323, filed Oct. 27, 2006, "Infusion Pumps And Methods And Delivery Devices And Methods With Same"; (vii) U.S. patent application Ser. No. 11/602,173, filed Nov. 20, 2006, "Systems And Methods Allowing For Reservoir Filling And Infusion Medium Delivery"; (viii) U.S. patent application Ser. No. 11/602,052, filed Nov. 20, 2006, "Systems And Methods Allowing For Reservoir Filling And Infusion Medium Delivery"; (ix) U.S. patent application Ser. No. 11/602,428, filed Nov. 20, 2006, "Systems And Methods Allowing For Reservoir Filling And Infusion Medium Delivery"; (x) U.S. patent application Ser. No. 11/602,113, filed Nov. 20, 2006, "Systems And Methods Allowing For Reservoir Filling And Infusion Medium Delivery"; (xi) U.S. patent application Ser. No. 11/604,171, filed Nov. 22, 2006, "Infusion Medium Delivery Device And Method With Drive Device For Driving Plunger In Reservoir"; (xii) U.S. patent application Ser. No. 11/604,172, filed Nov. 22, 2006, "Infusion Medium Delivery Device And Method With Drive Device For Driving Plunger In Reservoir"; (xiii) U.S. patent application Ser. No. 11/606,703, filed Nov. 30, 2006, "Infusion Pumps And Methods And Delivery Devices And Methods With Same"; (xiv) U.S. patent application Ser. No. 11/606,836, filed Nov. 30, 2006, "Infusion Pumps And Methods And Delivery Devices And Methods With Same"; U.S. patent application Ser. No. 11/636,384, filed Dec. 8, 2006, "Infusion Medium Delivery Device And Method With Compressible Or Curved Reservoir Or Conduit"; (xv) U.S. patent application Ser. No. 11/645,993, filed Dec. 26, 2006, "Infusion Medium Delivery Device And Method With Compressible Or Curved Reservoir Or Conduit"; U.S. patent application Ser. No. 11/645,972, filed Dec. 26, 2006, "Infusion Medium Delivery System, Device And Method With Needle Inserter And Needle Inserter Device And Method"; (xvi) U.S. patent application Ser. No. 11/646,052, filed Dec. 26, 2006, "Infusion Medium Delivery System, Device And Method With Needle Inserter And Needle Inserter Device And Method"; (xvii) U.S. patent application Ser. No. 11/645,435, filed Dec. 26, 2006, "Infusion Medium Delivery System, Device And Method With Needle Inserter And Needle Inserter Device And Method"; (xviii) U.S. patent application Ser. No. 11/646,000, filed Dec. 26, 2006, "Infusion Medium Delivery System, Device And Method With Needle Inserter And Needle Inserter Device And Method"; (xix) U.S. patent application Ser. No. 11/759,725, filed Jun. 7, 2007, "Infusion Medium Delivery Device And Method With Drive Device For Driving Plunger In Reservoir"; (xx) U.S. patent application Ser. No. 11/606,837, filed Nov. 30, 2006, "Method And Apparatus For Enhancing The Integrity Of An Implantable Sensor Device"; (xxi) U.S. patent application Ser. No. 11/702,713, filed Feb. 5, 2007, "Selective Potting For Controlled Failure And Electronic Devices Employing The Same"; (xxii) U.S. patent application Ser. No. 11/843,601, filed Aug. 22, 2007, "System And Method For Sensor Recalibration"; (xxiii) U.S. patent application Ser. No. 11/868,898, filed Oct. 8, 2007, "Multilayer Substrate"; (xxiv) U.S. patent application Ser. No. 11/964,649, filed Dec. 26, 2007, "System And Methods Allowing For Reservoir Air Bubble Management"; (xxv) U.S. patent application Ser. No. 12/111,751, filed Apr. 29, 2008, "Systems And Methods For Reservoir Filling"; (xxvi) U.S. patent application Ser. No. 12/111,815, filed Apr. 29, 2008, "Systems And Methods For Reservoir Air Bubble Management"; (xxvii) U.S. patent application Ser. No. 11/924,402, filed Oct. 25, 2007, "Sensor Substrate And Method Of Fabricating Same"; (xxviii) U.S. patent application Ser. No. 11/929,428, filed Oct. 30, 2007, "Telemetry System And Method With Variable Parameters"; (xxix) U.S. patent application Ser. No. 11/965,578, filed Dec. 27, 2007, "Reservoir Pressure Equalization Systems And Methods"; (xxx) U.S. patent application Ser. No. 12/107,580, filed Apr. 22, 2008, "Automative Filling Systems And Methods"; (xxxi) U.S. patent application Ser. No. 11/964,663, filed Dec. 26, 2007, "Medical Device With Full Options And Selective Enablement/Disablement"; (xxxii) U.S. patent application Ser. No. 10/180,732, filed Jun. 26, 2002, "Communication Station And Software For Interfacing With An Infusion Pump, Analyte Monitor, Analyte Meter, Or The Like"; (xxxiii) U.S. patent application Ser. No. 12/099,738, filed Apr. 8, 2008, "Systems And Methods Allowing For Reservoir Air Bubble Management"; (xxxiv) U.S. patent application Ser. No. 12/027,963, filed Feb. 7, 2008, "Adhesive Patch Systems And Methods"; (xxxv) U.S. patent application Ser. No. 12/121,647, filed May 15, 2008, "Multi-Lumen Catheter"; (xxxvi) U.S. Patent Provisional Application Ser. No. 61/044,269, filed Apr. 11, 2008, "Reservoir Plunger Head Systems And Methods"; (xxxvii) U.S. Patent Application Ser. No. 61/044,292, filed Apr. 11, 2008, "Reservoir Barrier Layer Systems And Methods"; (xxxviii) U.S. Patent Provisional Application Ser. No. 61/044,322, filed Apr. 11, 2008, "Reservoir Seal Retainer Systems And Methods"; (xxxix) U.S. patent application Ser. No. 12/179,502, filed Jul. 24, 2008, "Method For Formulating And Immobilizing A Matrix Protein And A Matrix Protein For Use In A Sensor"; (xl) U.S. patent application Ser. No. 12/336,367, filed Dec. 16, 2008, "Needle Insertions Systems And Methods"; (xli) U.S. patent application Ser. No. 12/166,210, filed Jul. 1, 2008, "Electronic Device For Controlled Failure"; (xlii) U.S. patent application Ser. No. 12/271,134, filed Nov. 14, 2008, "Multilayer Circuit Devices And Manufacturing Methods Using Electroplated Sacrificial Structures"; (xliii) U.S. patent application Ser. No. 12/171,971, filed Jul. 11, 2008, "Infusion Medium Delivery System, Device And Method With Needle Inserter And Needle Inserter Device And Method"; (xliv) U.S. patent application Ser. No. 12/189,077, filed Aug. 8, 2008, "Packaging System"; (xlv) U.S. patent application Ser. No. 12/179,536, filed Jul. 24, 2008, "Real Time Self-Adjusting Calibration Algorithm"; (xlvii) U.S. patent application Ser. No. 12/277,186, filed Nov. 24, 2008, "Infusion Medium Delivery System, Device And Method With Needle Inserter And Needle Inserter Device And Method"; (xlviii) U.S. patent application Ser. No. 12/211,783, filed Sep. 16, 2008, "Implantable Sensor Method And System"; (xlix) U.S. patent application Ser. No. 12/247,945, filed Oct. 8, 2008, "Infusion Medium Delivery Device And Method With Drive Device For Driving Plunger In Reservoir"; (l) U.S. patent application Ser. No. 12/360,077, filed Jan. 26, 2009, "Reservoir Barrier Layer Systems And Methods"; (li) U.S. patent application Ser. No. 12/345,362, filed Dec. 29, 2008, "Reservoir Seal Retainer Systems And Methods"; (lii) U.S. patent application Ser. No. 12/353,181, filed Jan. 13, 2009, "Systems And Methods Allowing For Reservoir Filling And Infusion Medium Delivery"; (liii) U.S. patent application Ser. No. 12/360,813, filed Jan. 27, 2009, "Multi-Position Infusion Set Device And Process"; (liv) U.S. Patent Pub. No. US 2007/0142776 (application Ser. No. 10/314,653), filed Dec. 9, 2002, "Insertion Device For An Insertion Set and Methods Of Using The Same"; (lv) U.S. patent application Ser. No. 12/649,619, filed Dec. 30, 2009, entitled "Alignment Systems and Methods"; (lvi) U.S. patent application Ser. No. 12/650,287, filed Dec. 30, 2009, entitled "Engagement and Sensing Systems and Methods"; and (lvii) U.S. patent application Ser. No. 12/650,378, filed Dec. 30, 2009, entitled "Connection and Alignment Systems and Methods. In other embodiments, the system 10, delivery device 12, sensing device 14, CCD 16, and computer 18 may have other suitable configurations.

The delivery device 12 may be configured to deliver fluidic media to the body 5 of the user-patient 7. In various embodiments, fluidic media may include a liquid, a fluid, a gel, or the like. In some embodiments, fluidic media may include a medicine or a drug for treating a disease or a medical condition. For example, fluidic media may include insulin for treating diabetes, or may include a drug for treating pain, cancer, a pulmonary disorder, HIV, or the like. In some embodiments, fluidic media may include a nutritional supplement, a dye, a tracing medium, a saline medium, a hydration medium, or the like.

The sensing device 14 may include a sensor, a monitor, or the like, for providing sensor data or monitor data. In various embodiments, the sensing device 14 may be configured to sense a condition of the user-patient 7. For example, the sensing device 14 may include electronics and enzymes reactive to a biological condition, such as a blood glucose level, or the like, of the user-patient 7.

In various embodiments, the sensing device 14 may be secured to the body 5 of the user-patient 7 or embedded in the body 5 of the user-patient 7 at a location that is remote from the location at which the delivery device 12 is secured to the body 5 of the user-patient 7. In various other embodiments, the sensing device 14 may be incorporated within the delivery device 12. In other embodiments, the sensing device 14 may be separate and apart from the delivery device, and may be, for example, part of the CCD 16. In such embodiments, the sensing device 14 may be configured to receive a biological sample, analyte, or the like, to measure a condition of the user-patient 7.

In further embodiments, the sensing device 14 and/or the delivery device 12 may utilize a closed-loop system. Examples of sensing devices and/or delivery devices utilizing closed-loop systems may be found at, but are not limited to, the following references: (i) U.S. Pat. No. 6,088,608, entitled "Electrochemical Sensor And Integrity Tests Therefor"; (ii) U.S. Pat. No. 6,119,028, entitled "Implantable Enzyme-Based Monitoring Systems Having Improved Longevity Due To Improved Exterior Surfaces"; (iii) U.S. Pat. No. 6,589,229, entitled "Implantable Enzyme-Based Monitoring Systems Adapted for Long Term Use"; (iv) U.S. Pat. No. 6,740,072, entitled "System And Method For Providing Closed Loop Infusion Formulation Delivery"; (v) U.S. Pat. No. 6,827,702, entitled "Safety Limits For Closed-Loop Infusion Pump Control"; (vi) U.S. Pat. No. 7,323,142, entitled "Sensor Substrate And Method Of Fabricating Same"; (vii) U.S. patent application Ser. No. 09/360,342, filed Jul. 22, 1999, entitled "Substrate Sensor"; and (viii) U.S. Provisional Patent Application Ser. No. 60/318,060, filed Sep. 7, 2001, entitled "Sensing Apparatus and Process", all of which are incorporated herein by reference in their entirety.

In such embodiments, the sensing device 14 may be configured to sense a condition of the user-patient 7, such as, but not limited to, blood glucose level, or the like. The delivery device 12 may be configured to deliver fluidic media in response to the condition sensed by the sensing device 14. In turn, the sensing device 14 may continue to sense a new condition of the user-patient, allowing the delivery device 12 to deliver fluidic media continuously in response to the new condition sensed by the sensing device 14 indefinitely. In some embodiments, the sensing device 14 and/or the delivery device 12 may be configured to utilize the closed-loop system only for a portion of the day, for example only when the user-patient is asleep or awake.

Each of the delivery device 12, the sensing device 14, the CCD 16, and the computer 18 may include transmitter, receiver, or transceiver electronics that allow for communication with other components of the system 10. The sensing device 14 may be configured to transmit sensor data or monitor data to the delivery device 12. The sensing device 14 may also be configured to communicate with the CCD 16. The delivery device 12 may include electronics and software that are configured to analyze sensor data and to deliver fluidic media to the body 5 of the user-patient 7 based on the sensor data and/or preprogrammed delivery routines.

The CCD 16 and the computer 18 may include electronics and other components configured to perform processing, delivery routine storage, and to control the delivery device 12.

By including control functions in the CCD 16 and/or the computer 18, the delivery device 12 may be made with more simplified electronics. However, in some embodiments, the delivery device 12 may include all control functions, and may operate without the CCD 16 and the computer 18. In various embodiments, the CCD 16 may be a portable electronic device. In addition, in various embodiments, the delivery device 12 and/or the sensing device 14 may be configured to transmit data to the CCD 16 and/or the computer 18 for display or processing of the data by the CCD 16 and/or the computer 18.

In some embodiments, the sensing device 14 may be integrated into the CCD 16. Such embodiments may allow the user-patient to monitor a condition by providing, for example, a sample of his or her blood to the sensing device 14 to assess his or her condition. In some embodiments, the sensing device 14 and the CCD 16 may be for determining glucose levels in the blood and/or body fluids of the user-patient without the use of, or necessity of, a wire or cable connection between the delivery device 12 and the sensing device 14 and/or the CCD 16.

In some embodiments, the CCD 16 may be for providing information to the user-patient that facilitates the user-patient's subsequent use of a drug delivery system. For example, the CCD 16 may provide information to the user-patient to allow the user-patient to determine the rate or dose of medication to be administered into the body of the user-patient. In other embodiments, the CCD 16 may provide information to the delivery device 12 to control the rate or dose of medication administered into the body of the user-patient Examples of the types of communications and/or control capabilities, as well as device feature sets and/or program options may be found in the following references: (i) U.S. patent application Ser. No. 10/445,477, filed May 27, 2003, entitled "External Infusion Device with Remote Programming, Bolus Estimator and/or Vibration Alarm Capabilities"; (ii) U.S. patent application Ser. No. 10/429,385, filed May 5, 2003, entitled "Handheld Personal Data Assistant (PDA) with a Medical Device and Method of Using the Same"; and (iii) U.S. patent application Ser. No. 09/813,660, filed Mar. 21, 2001, entitled "Control Tabs for Infusion Devices and Methods of Using the Same," all of which are incorporated herein by reference in their entirety.

Figure 2:
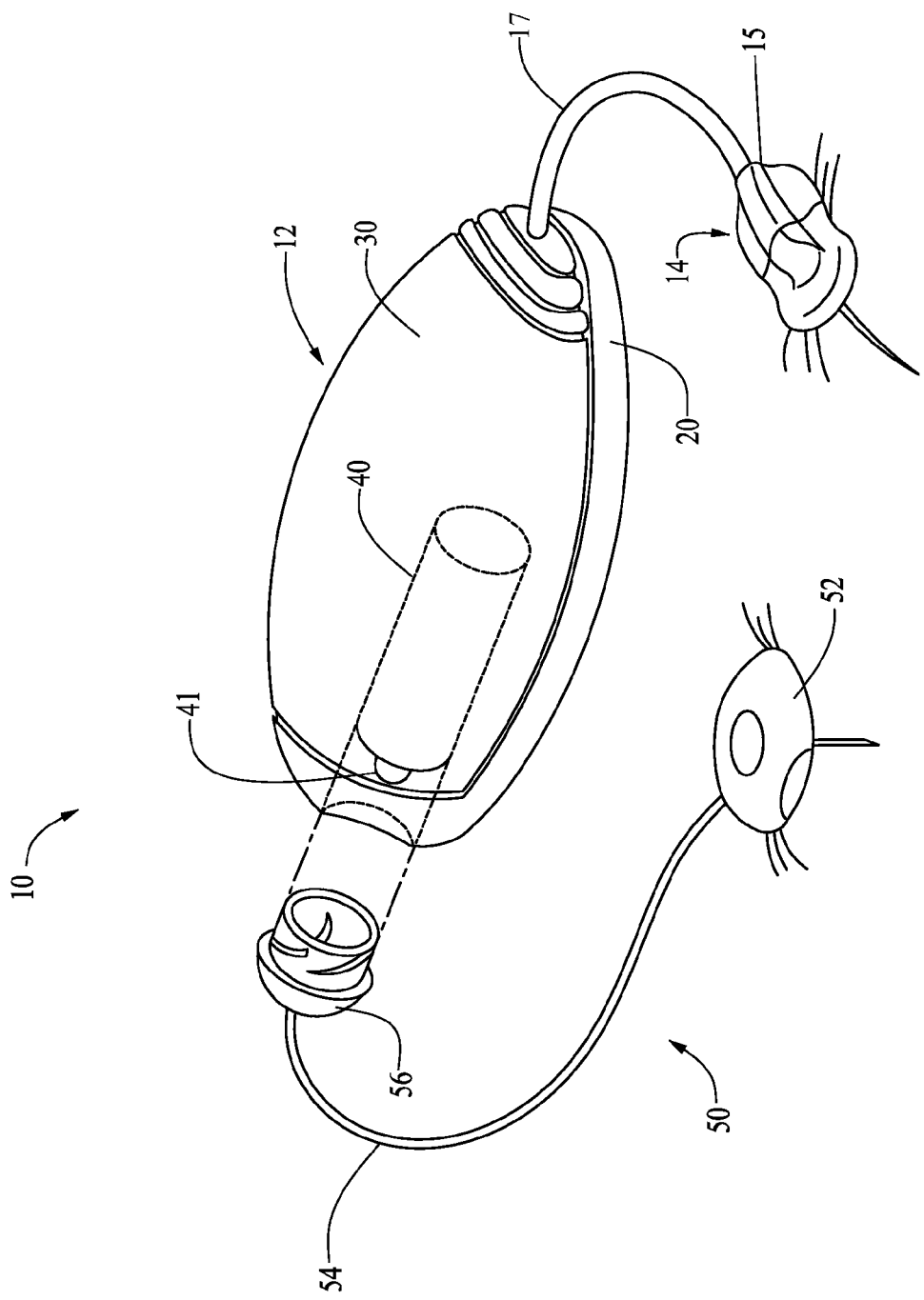
FIG. 2 illustrates an example of a system in accordance with an embodiment of the present invention.

FIG. 2 illustrates an example of the system 10 in accordance with an embodiment of the present invention. The system 10 in accordance with the embodiment illustrated in FIG. 2 includes the delivery device 12 and the sensing device 14. The delivery device 12 in accordance with an embodiment of the present invention may include a disposable housing 20, a durable housing 30, and a reservoir system 40. The delivery device 12 may further include an infusion path 50.

Elements of the delivery device 12 that ordinarily contact the body of a user-patient or that ordinarily contact fluidic media during operation of the delivery device 12 may be considered as a disposable portion of the delivery device 12. For example, a disposable portion of the delivery device 12 may include the disposable housing 20 and the reservoir system 40. The disposable portion of the delivery device 12 may be recommended for disposal after a specified number of uses.

On the other hand, elements of the delivery device 12 that do not ordinarily contact the body of the user-patient or fluidic media during operation of the delivery device 12 may be considered as a durable portion of the delivery device 12. For example, a durable portion of the delivery device 12 may include the durable housing 30, electronics (not shown in FIG. 2), a drive device having a motor and drive linkage (not shown in FIG. 2), and the like. Elements of the durable housing portion of the delivery device 12 are typically not contaminated from contact with the user-patient or fluidic media during normal operation of the delivery device 12 and, thus, may be retained for re-use with replaced disposable portions of the delivery device 12.

In various embodiments, the disposable housing 20 may support the reservoir system 40 and has a bottom surface (facing downward and into the page in FIG. 2) configured to secure to the body of the user-patient. An adhesive may be employed at an interface between the bottom surface of the disposable housing 20 and the skin of the user-patient to adhere the disposable housing 20 to the skin of the user-patient. In various embodiments, the adhesive may be provided on the bottom surface of the disposable housing 20, with a peelable cover layer covering the adhesive material. In this manner, the cover layer may be peeled off to expose the adhesive material, and the adhesive side of the disposable housing 20 may be placed against the user-patient, for example against the skin of the user-patient. Thus in some embodiments, the delivery device 12 may be attached to the skin of the user-patient.

In other embodiments, the disposable housing 20 and/or the remaining portions of the delivery device 12 may be worn or otherwise attached on or underneath clothing of the user-patient. Similarly, the delivery device 12 may be supported by any suitable manner, such as, but not limited to, on a belt, in a pocket, and the like. Representative examples of such delivery devices 12, and delivery devices in general, may include, but is not limited to, the MiniMed Paradigm 522 Insulin Pump, MiniMed Paradigm 722 Insulin Pump, MiniMed Paradigm 515 Insulin Pump, MiniMed Paradigm 715 Insulin Pump, MiniMed Paradigm 512R Insulin Pump, MiniMed Paradigm 712R Insulin Pump, MiniMed 508 Insulin Pump, MiniMed 508R Insulin Pump, and any other derivatives thereof.

The reservoir system 40 may be configured for containing or holding fluidic media, such as, but not limited to insulin. In various embodiments, the reservoir system 40 may include a hollow interior volume for receiving fluidic media, such as, but not limited to, a cylinder-shaped volume, a tubular-shaped volume, or the like. In some embodiments, the reservoir system 40 may be provided as a cartridge or canister for containing fluidic media. In various embodiments, the reservoir system 40 can be refilled with fluidic media. In further embodiments, the reservoir system 40 is pre-filled with fluidic media.

The reservoir system 40 may be supported by the disposable housing 20 in any suitable manner. For example, the disposable housing 20 may be provided with projections or struts (not shown), or a trough feature (not shown), for holding the reservoir system 40. In some embodiments, the reservoir system 40 may be supported by the disposable housing 20 in a manner that allows the reservoir system 40 to be removed from the disposable housing 20 and replaced with another reservoir. Alternatively, or in addition, the reservoir system 40 may be secured to the disposable housing 20 by a suitable adhesive, a strap, or other coupling structure.

In various embodiments, the reservoir system 40 may include at least one port 41 for allowing fluidic media to flow into and/or flow out of the interior volume of the reservoir system 40. In some embodiments, the infusion path 50 may include a connector 56, a tube 54, and a needle apparatus 52. The connector 56 of the infusion path 50 may be connectable to the port 41 of the reservoir system 40. In various embodiments, the disposable housing 20 may be configured with an opening near the port 41 of the reservoir system 40 for allowing the connector 56 of the infusion path 50 to be selectively connected to and disconnected from the port 41 of the reservoir system 40.

In various embodiments, the port 41 of the reservoir system 40 may be covered with or supports a septum (not shown in FIG. 2), such as a self-sealing septum, or the like. The septum may be configured to prevent fluidic media from flowing out of the reservoir system 40 through the port 41 when the septum is not pierced. In addition, in various embodiments, the connector 56 of the infusion path 50 may include a needle for piercing the septum covering the port 41 of the reservoir system 40 to allow fluidic media to flow out of the interior volume of the reservoir system 40.

Examples of needle/septum connectors can be found in U.S. patent application Ser. No. 10/328,393, filed Dec. 22, 2003, entitled "Reservoir Connector," which is incorporated herein by reference in its entirety. In other alternatives, non-septum connectors such as Luer locks, or the like may be used. In various embodiments, the needle apparatus 52 of the infusion path 50 may include a needle that is able to puncture the skin of the user-patient. In addition, in various embodiments, the tube 54 connects the connector 56 with the needle apparatus 52 and may be hollow, such that the infusion path 50 is able to provide a path to allow for the delivery of fluidic media from the reservoir system 40 to the body of a user-patient.

The durable housing 30 of the delivery device 12 in accordance with various embodiments of the present invention includes a housing shell configured to mate with and secure to the disposable housing 20. The durable housing 30 and the disposable housing 20 may be provided with correspondingly shaped grooves, notches, tabs, or other suitable features that allow the two parts to connect together easily, by manually pressing the two housings together, by twist or threaded connection, or other suitable manner of connecting the parts that is well known in the mechanical arts.

In various embodiments, the durable housing 30 and the disposable housing 20 may be connected to each other using a twist action. The durable housing 30 and the disposable housing 20 may be configured to be separable from each other when a sufficient force is applied to disconnect the two housings from each other. For example, in some embodiments the disposable housing 20 and the durable housing 30 may be snapped together by friction fitting. In various embodiments, a suitable seal, such as an o-ring seal, may be placed along a peripheral edge of the durable housing 30 and/or the disposable housing 20 to provide a seal against water entering between the durable housing 30 and the disposable housing 20.

The durable housing 30 of the delivery device 12 may support a drive device (not shown in FIG. 2), including a motor and a drive device linkage portion, for applying a force to fluidic media within the reservoir system 40 to force fluidic media out of the reservoir system 40 and into an infusion path, such as the infusion path 50, for delivery to a user-patient. For example, in some embodiments, an electrically driven motor may be mounted within the durable housing 30 with appropriate linkage for operatively coupling the motor to a plunger arm (not shown in FIG. 2) connected to a plunger head (not shown in FIG. 2) that is within the reservoir system 40 and to drive the plunger head in a direction to force fluidic media out of the port 41 of the reservoir system 40 and to the user-patient.

Also, in some embodiments, the motor may be controllable to reverse direction to move the plunger arm and the plunger head to cause fluid to be drawn into the reservoir system 40 from a patient. The motor may be arranged within the durable housing 30 and the reservoir system 40 may be correspondingly arranged on the disposable housing 20, such that the operable engagement of the motor with the plunger head, through the appropriate linkage, occurs automatically upon the user-patient connecting the durable housing 30 with the disposable housing 20 of the delivery device 12. Further examples of linkage and control structures may be found in U.S. patent application Ser. No. 09/813,660, filed Mar. 21, 2001, entitled "Control Tabs for Infusion Devices and Methods of Using the Same," which is incorporated herein by reference in its entirety.

In various embodiments, the durable housing 30 and the disposable housing 20 may be made of suitably rigid materials that maintain their shape, yet provide sufficient flexibility and resilience to effectively connect together and disconnect, as described above. The material of the disposable housing 20 may be selected for suitable compatibility with skin. For example, the disposable housing 20 and the durable housing 30 of the delivery device 12 may be made of any suitable plastic, metal, composite material, or the like. The disposable housing 20 may be made of the same type of material or a different material relative to the durable housing 30. In some embodiments, the disposable housing 20 and the durable housing 30 may be manufactured by injection molding or other molding processes, machining processes, or combinations thereof.

For example, the disposable housing 20 may be made of a relatively flexible material, such as a flexible silicone, plastic, rubber, synthetic rubber, or the like. By forming the disposable housing 20 of a material capable of flexing with the skin of a user-patient, a greater level of user-patient comfort may be achieved when the disposable housing 20 is secured to the skin of the user-patient. In addition, a flexible disposable housing 20 may result in an increase in site options on the body of the user-patient at which the disposable housing 20 may be secured.

In the embodiment illustrated in FIG. 2, the delivery device 12 is connected to the sensing device 14 through a connection element 17 of the sensing device 14. The sensing device 14 may include a sensor 15 that includes any suitable biological or environmental sensing device, depending upon a nature of a treatment to be administered by the delivery device 12. For example, in the context of delivering insulin to a diabetes patient, the sensor 15 may include a blood glucose sensor, or the like.

In some embodiments, the sensor 15 may include a continuous glucose sensor. The continuous glucose sensor may be implantable within the body of the user-patient. In other embodiments, the continuous glucose sensor may be located externally, for example on the skin of the user-patient, or attached to clothing of the user-patient. In such embodiments, fluid may be drawn continually from the user-patient and sensed by the continuous glucose sensor. In various embodiments, the continuous glucose sensor may be configured to sense and/or communicate with the CCD 16 continuously. In other embodiments, the continuous glucose sensor may be configured to sense and/or communicate with the CCD 16 intermittently, for example sense glucose levels and transmit information every few minutes. In various embodiments, the continuous glucose sensor may utilize glucose oxidase.

The sensor 15 may be an external sensor that secures to the skin of a user-patient or, in other embodiments, may be an implantable sensor that is located in an implant site within the body of the user-patient. In further alternatives, the sensor may be included with as a part or along side the infusion cannula and/or needle, such as for example as shown in U.S. patent application Ser. No. 11/149,119, filed Jun. 8, 2005, entitled "Dual Insertion Set," which is incorporated herein by reference in its entirety. In the illustrated example of FIG. 2, the sensor 15 is an external sensor having a disposable needle pad that includes a needle for piercing the skin of the user-patient and enzymes and/or electronics reactive to a biological condition, such as blood glucose level or the like, of the user-patient. In this manner, the delivery device 12 may be provided with sensor data from the sensor 15 secured to the user-patient at a site remote from the location at which the delivery device 12 is secured to the user-patient.

While the embodiment shown in FIG. 2 may include a sensor 15 connected by the connection element 17 for providing sensor data to sensor electronics (not shown in FIG. 2) located within the durable housing 30 of the delivery device 12, other embodiments may employ a sensor 15 located within the delivery device 12. Yet other embodiments may employ a sensor 15 having a transmitter for communicating sensor data by a wireless communication link with receiver electronics (not shown in FIG. 2) located within the durable housing 30 of the delivery device 12. In various embodiments, a wireless connection between the sensor 15 and the receiver electronics within the durable housing 30 of the delivery device 12 may include a radio frequency (RF) connection, an optical connection, or another suitable wireless communication link. Further embodiments need not employ the sensing device 14 and, instead, may provide fluidic media delivery functions without the use of sensor data.

As described above, by separating disposable elements of the delivery device 12 from durable elements, the disposable elements may be arranged on the disposable housing 20, while durable elements may be arranged within a separable durable housing 30. In this regard, after a prescribed number of uses of the delivery device 12, the disposable housing 20 may be separated from the durable housing 30, so that the disposable housing 20 may be disposed of in a proper manner. The durable housing 30 may then be mated with a new (unused) disposable housing 20 for further delivery operation with a user-patient.

Figure 3:
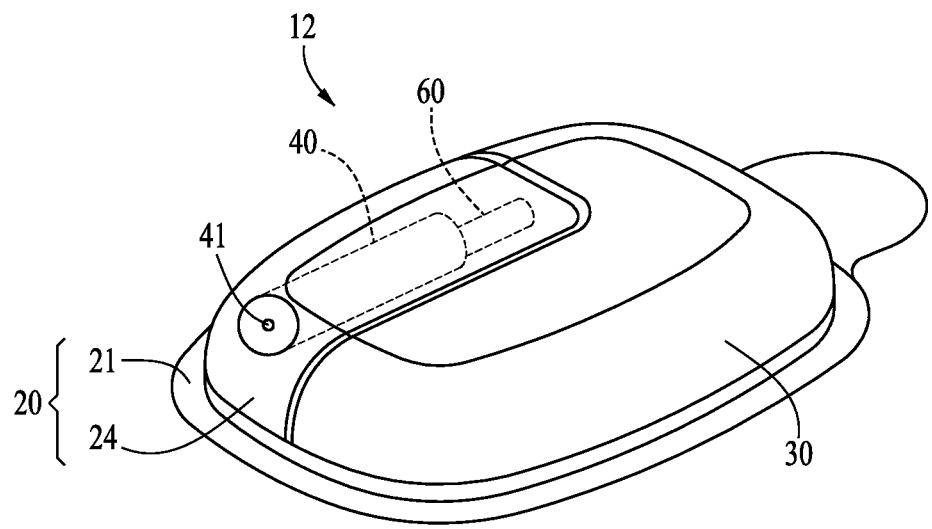
FIG. 3 illustrates an example of a delivery device in accordance with an embodiment of the present invention.

FIG. 3 illustrates an example of the delivery device 12 in accordance with another embodiment of the present invention. The delivery device 12 of the embodiment of FIG. 3 is similar to the delivery device 12 of the embodiment of FIG. 2. While the delivery device 12 in the embodiment illustrated in FIG. 2 provides for the durable housing 30 to cover the reservoir system 40, the delivery device 12 in the embodiment of FIG. 3 provides for the durable housing 30 to secure to the disposable housing 20 without covering the reservoir system 40. The delivery device 12 of the embodiment illustrated in FIG. 3 includes the disposable housing 20, and the disposable housing 20 in accordance with the embodiment illustrated in FIG. 3 includes a base 21 and a reservoir retaining portion 24. In one embodiment, the base 21 and reservoir retaining portion 24 may be formed as a single, unitary structure.

The base 21 of the disposable housing 20 may be configured to be securable to a body of a user-patient. The reservoir-retaining portion 24 of the disposable housing 20 is configured to house the reservoir system 40. The reservoir-retaining portion 24 of the disposable housing 20 may be configured to have an opening to allow for the port 41 of the reservoir system 40 to be accessed from outside of the reservoir-retaining portion 24 while the reservoir system 40 is housed in the reservoir-retaining portion 24. The durable housing 30 may be configured to be attachable to and detachable from the base 21 of the disposable housing 20. The delivery device 12 in the embodiment illustrated in FIG. 3 includes a plunger arm 60 that is connected to or that is connectable to a plunger head (not shown in FIG. 3) within the reservoir system 40.

Figure 4:
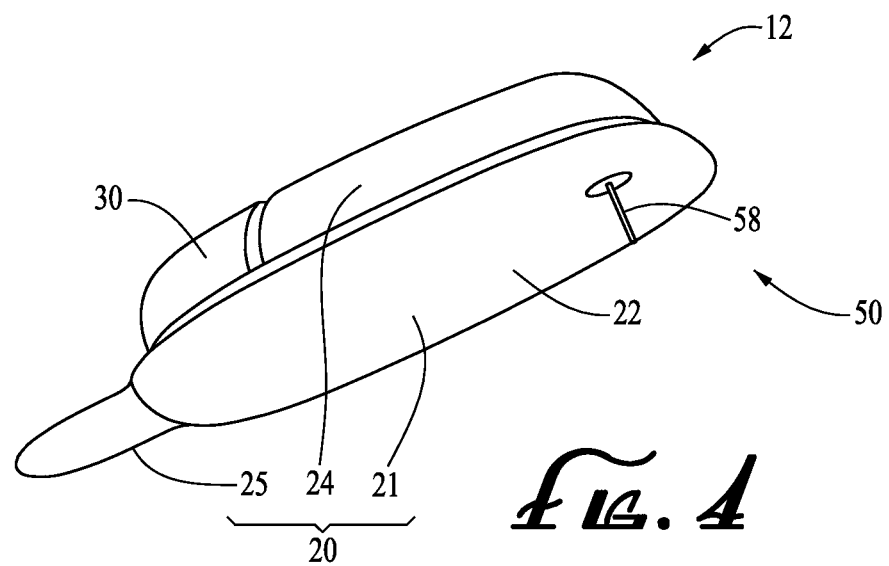
FIG. 4 illustrates a delivery device in accordance with an embodiment of the present invention.

FIG. 4 illustrates another view of the delivery device 12 of the embodiment of FIG. 3. The delivery device 12 of the embodiment illustrated in FIG. 4 includes the disposable housing 20, the durable housing 30, and the infusion path 50. The disposable housing 20 in the embodiment of FIG. 4 includes the base 21, the reservoir-retaining portion 24, and a peelable cover layer 25. The peelable cover layer 25 may cover an adhesive material on the bottom surface 22 of the base 21. The peelable cover layer 25 may be configured to be peelable by a user-patient to expose the adhesive material on the bottom surface 22 of the base 21. In some embodiments, there may be multiple adhesive layers on the bottom surface 22 of the base 21 that are separated by peelable layers.

The infusion path 50 in accordance with the embodiment of the present invention illustrated in FIG. 4 includes the needle 58 rather than the connector 56, the tube 54, and the needle apparatus 52 as shown in the embodiment of FIG. 2. The base 21 of the disposable housing 20 may be provided with an opening or pierceable wall in alignment with a tip of the needle 58, to allow the needle 58 to pass through the base 21 and into the skin of a user-patient under the base 21, when extended. In this manner, the needle 58 may be used to pierce the skin of the user-patient and deliver fluidic media to the user-patient.

Alternatively, the needle 58 may be extended through a hollow cannula (not shown in FIG. 4), such that upon piercing the skin of the user-patient with the needle 58, an end of the hollow cannula is guided through the skin of the user-patient by the needle 58. Thereafter, the needle 58 may be removed, leaving the hollow cannula in place, with one end of the cannula located within the body of the user-patient and the other end of the cannula in fluid flow connection with fluidic media within the reservoir system 40, to convey pumped infusion media from the reservoir system 40 to the body of the user-patient.

Figure 5A:
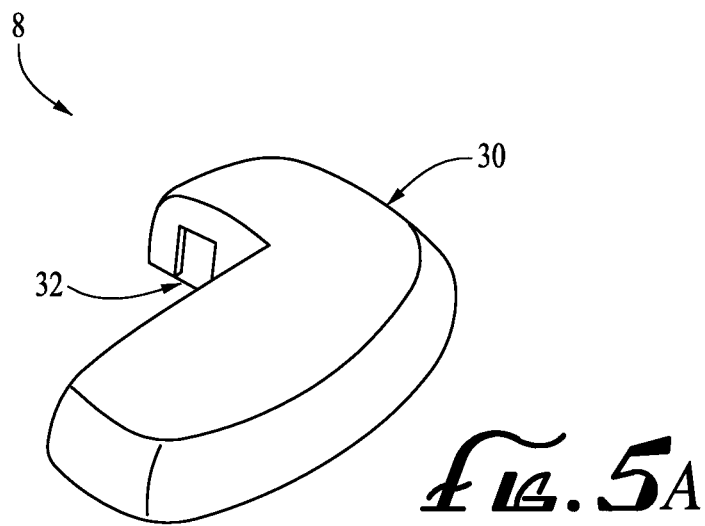
FIG. 5A illustrates a durable portion of a delivery device in accordance with an embodiment of the present invention.
Figure 5B:
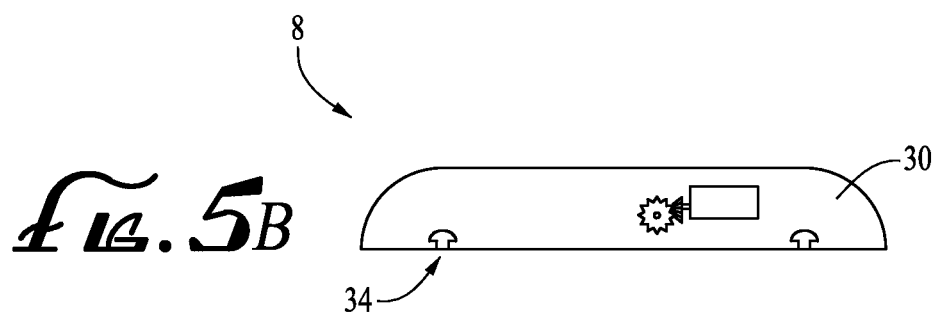
FIG. 5B illustrates a section view of a durable portion of a delivery device in accordance with an embodiment of the present invention.
Figure 5C:
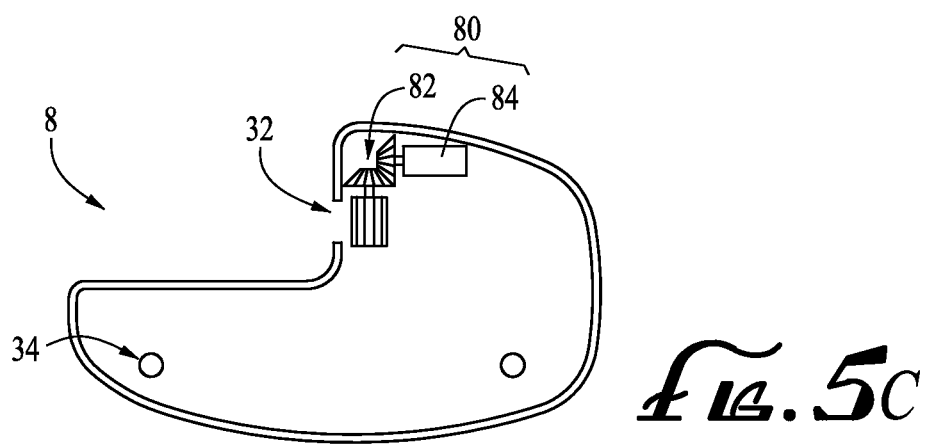
FIG. 5C illustrates a section view of a durable portion of a delivery device in accordance with an embodiment of the present invention.

FIG. 5A illustrates a durable portion 8 of the delivery device 12 (refer to FIG. 3) in accordance with an embodiment of the present invention. FIG. 5B illustrates a section view of the durable portion 8 in accordance with an embodiment of the present invention. FIG. 5C illustrates another section view of the durable portion 8 in accordance with an embodiment of the present invention. With reference to FIGS. 5A, 5B, and 5C, in various embodiments, the durable portion 8 may include the durable housing 30, and a drive device 80. The drive device 80 may include a motor 84 and a drive device linkage portion 82.

In various embodiments, the durable housing 30 may include an interior volume for housing the motor 84, the drive device linkage portion 82, other electronic circuitry, and a power source (not shown in FIGS. 5A, 5B, and 5C). In addition, in various embodiments, the durable housing 30 may be configured with an opening 32 for receiving a plunger arm 60 (refer to FIG. 3). In addition, in various embodiments, the durable housing 30 may include one or more connection members 34, such as tabs, insertion holes, or the like, for connecting with the base 21 of the disposable housing 20 (refer to FIG. 3).

Figure 6A:
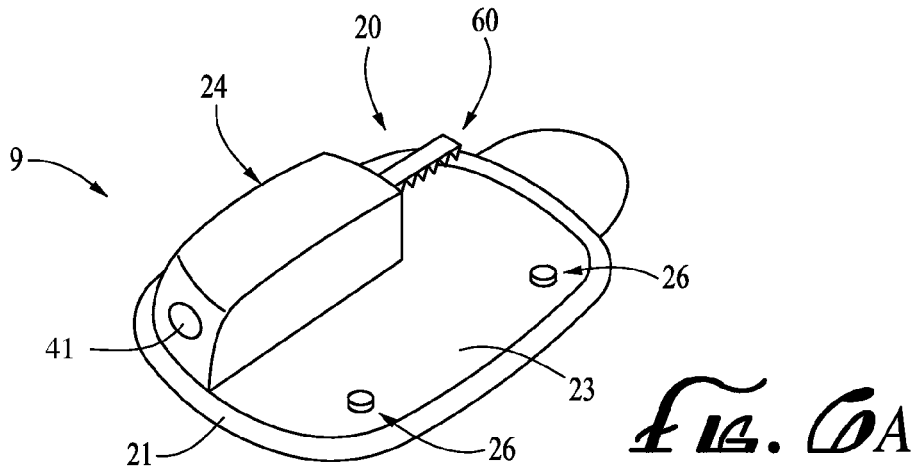
FIG. 6A illustrates a disposable portion of a delivery device in accordance with an embodiment of the present invention.
Figure 6B:
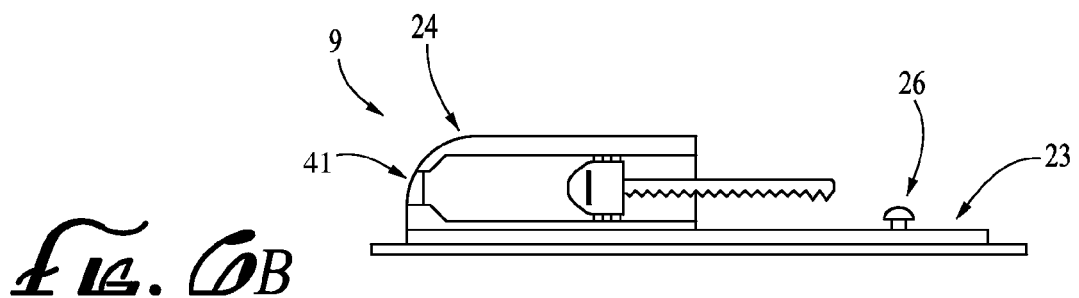
FIG. 6B illustrates a section view of a disposable portion of a delivery device in accordance with an embodiment of the present invention.
Figure 6C:
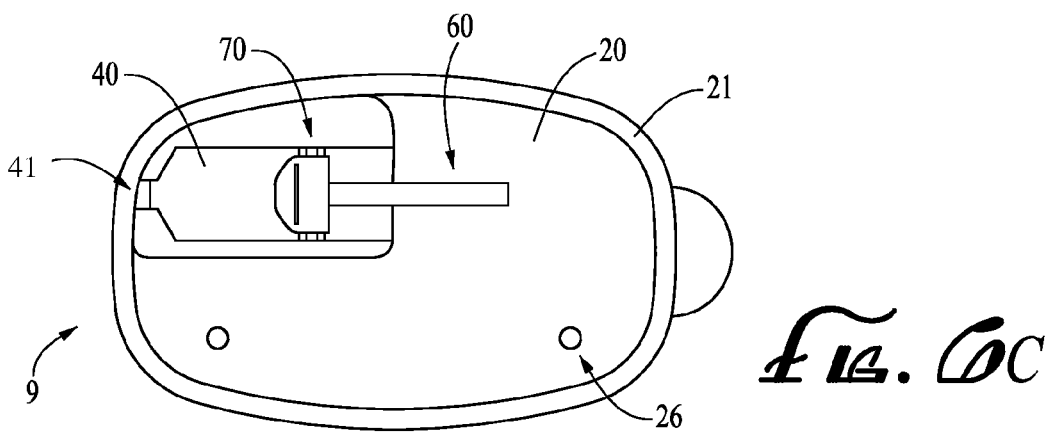
FIG. 6C illustrates a section view of a disposable portion of a delivery device in accordance with an embodiment of the present invention.

FIG. 6A illustrates a disposable portion 9 of the delivery device 12 (refer to FIG. 3) in accordance with an embodiment of the present invention. FIG. 6B illustrates a section view of the disposable portion 9 in accordance with an embodiment of the present invention. FIG. 6C illustrates another section view of the disposable portion 9 in accordance with an embodiment of the present invention. With reference to FIGS. 6A, 6B, and 6C, in various embodiments, the disposable portion 9 includes the disposable housing 20, the reservoir system 40, the plunger arm 60, and a plunger head 70. In some embodiments, the disposable housing 20 may include the base 21 and the reservoir-retaining portion 24. In various embodiments, the base 21 may include a top surface 23 having one or more connection members 26, such as tabs, grooves, or the like, for allowing connections with the one or more connection members 34 of embodiments of the durable housing 30 (refer to FIG. 5B).

In various embodiments, the reservoir system 40 may be housed within the reservoir retaining portion 24 of the disposable housing 20, and the reservoir system 40 may be configured to hold fluidic media. In addition, in various embodiments, the plunger head 70 may be disposed at least partially within the reservoir system 40 and may be moveable within the reservoir system 40 to allow fluidic media to fill into the reservoir system 40 and to force fluidic media out of the reservoir system 40. In some embodiments, the plunger arm 60 may be connected to or is connectable to the plunger head 70.

Also, in some embodiments, a portion of the plunger arm 60 may extend to outside of the reservoir-retaining portion 24 of the disposable housing 20. In various embodiments, the plunger arm 60 may have a mating portion for mating with the drive device linkage portion 82 of the drive device 80 (refer to FIG. 5C). With reference to FIGS. 5C and 6C, in some embodiments, the durable housing 30 may be snap fitted onto the disposable housing 20, whereupon the drive device linkage portion 82 automatically engages the mating portion of the plunger arm 60.

When the durable housing 30 and the disposable housing 20 are fitted together with the drive device linkage portion 82 engaging or mating with the plunger arm 60, the motor 84 may be controlled to drive the drive device linkage portion 82 and, thus, move the plunger arm 60 to cause the plunger head 70 to move within the reservoir system 40. When the interior volume of the reservoir system 40 is filled with fluidic media and an infusion path is provided from the reservoir system 40 to the body of a user-patient, the plunger head 70 may be moved within the reservoir system 40 to force fluidic media from the reservoir system 40 and into the infusion path, so as to deliver fluidic media to the body of the user-patient.

In various embodiments, once the reservoir system 40 has been sufficiently emptied or otherwise requires replacement, the user-patient may simply remove the durable housing 30 from the disposable housing 20, and replace the disposable portion 9, including the reservoir system 40, with a new disposable portion having a new reservoir. The durable housing 30 may be connected to the new disposable housing of the new disposable portion, and the delivery device including the new disposable portion may be secured to the skin of a user-patient, or otherwise attached to the user-patient.

In various other embodiments, rather than replacing the entire disposable portion 9 every time the reservoir system 40 is emptied, the reservoir system 40 may be refilled with fluidic media. In some embodiments, the reservoir system 40 may be refilled while remaining within the reservoir retaining portion 24 (refer to FIG. 6B) of the disposable housing 20. In addition, in various embodiments, the reservoir system 40 may be replaced with a new reservoir (not shown), while the disposable housing 20 may be re-used with the new reservoir. In such embodiments, the new reservoir may be inserted into the disposable portion 9.

With reference to FIGS. 3, 5A, 6B, and 6C, in various embodiments, the delivery device 12 may include reservoir status circuitry (not shown), and the reservoir system 40 may include reservoir circuitry (not shown). In various embodiments, the reservoir circuitry stores information such as, but not limited to, at least one of (i) an identification string identifying the reservoir system 40; (ii) a manufacturer of the reservoir system 40; (iii) contents of the reservoir system 40; and (iv) an amount of contents in the reservoir system 40. In some embodiments, the delivery device 12 may include the reservoir status circuitry (not shown), and the reservoir status circuitry may be configured to read data from the reservoir circuitry (not shown) when the reservoir system 40 is inserted into the disposable portion 9.

In various embodiments, the reservoir status circuitry (not shown) may be further configured to store data to the reservoir circuitry after at least some of the contents of the reservoir system 40 have been transferred out of the reservoir system 40 to update information in the reservoir circuitry (not shown) related to an amount of contents still remaining in the reservoir system 40. In some embodiments, the reservoir status circuitry (not shown) may be configured to store data to the reservoir circuitry (not shown) to update information in the reservoir circuitry (not shown) related to an amount of contents remaining in the reservoir system 40 when the reservoir system 40 is inserted into the disposable portion 9. In some embodiments, the delivery device 12 may include the reservoir status circuitry (not shown) and the reservoir system 40 may include the reservoir circuitry (not shown), and the reservoir status circuitry (not shown) may selectively inhibit use of the delivery device 12 or may selectively provide a warning signal based on information read by the reservoir status circuitry (not shown) from the reservoir circuitry (not shown).

Figure 7:
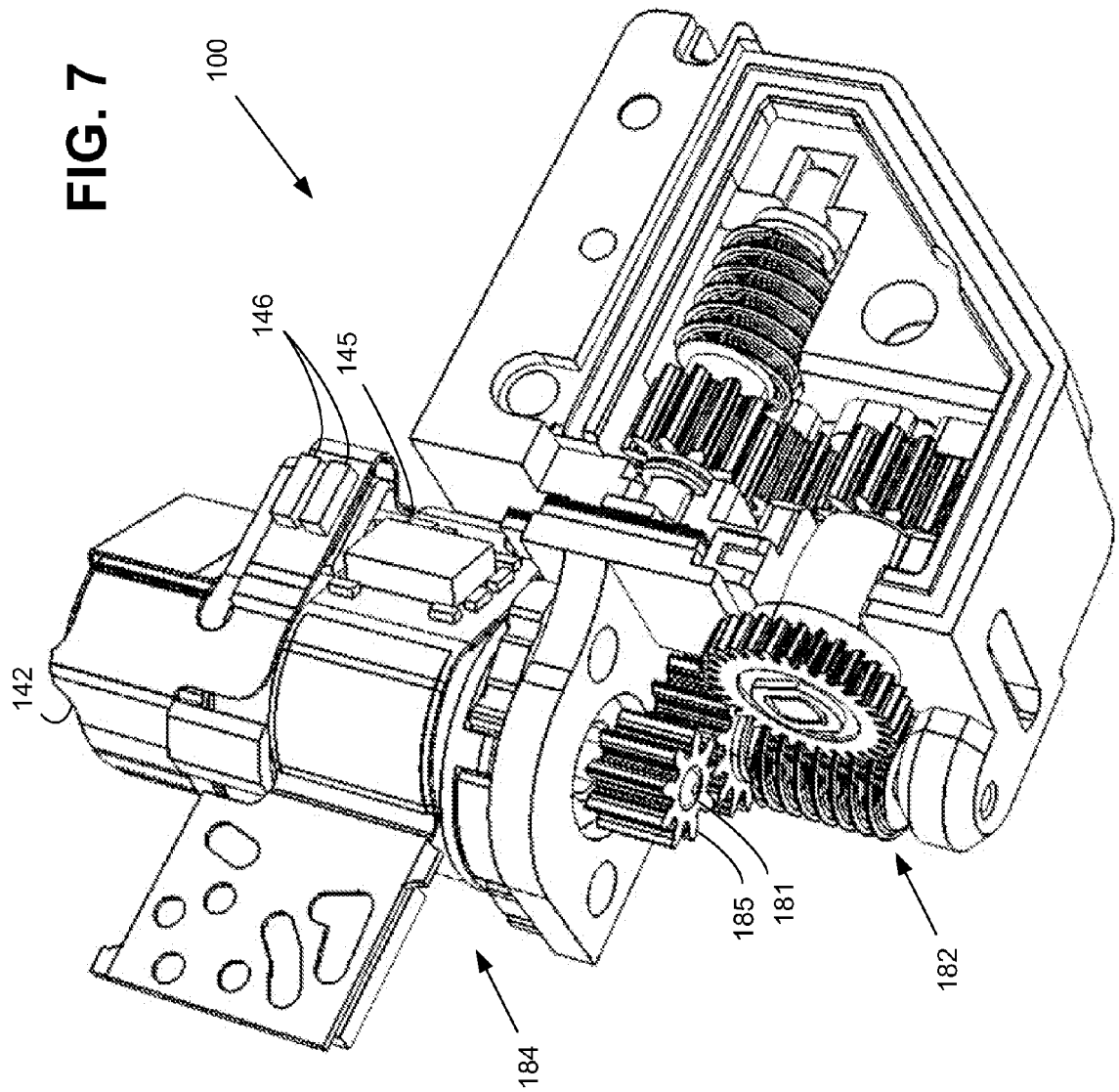
FIG. 7 illustrates a drive device of a medical device system in accordance with an embodiment of the present invention.
Figure 8:
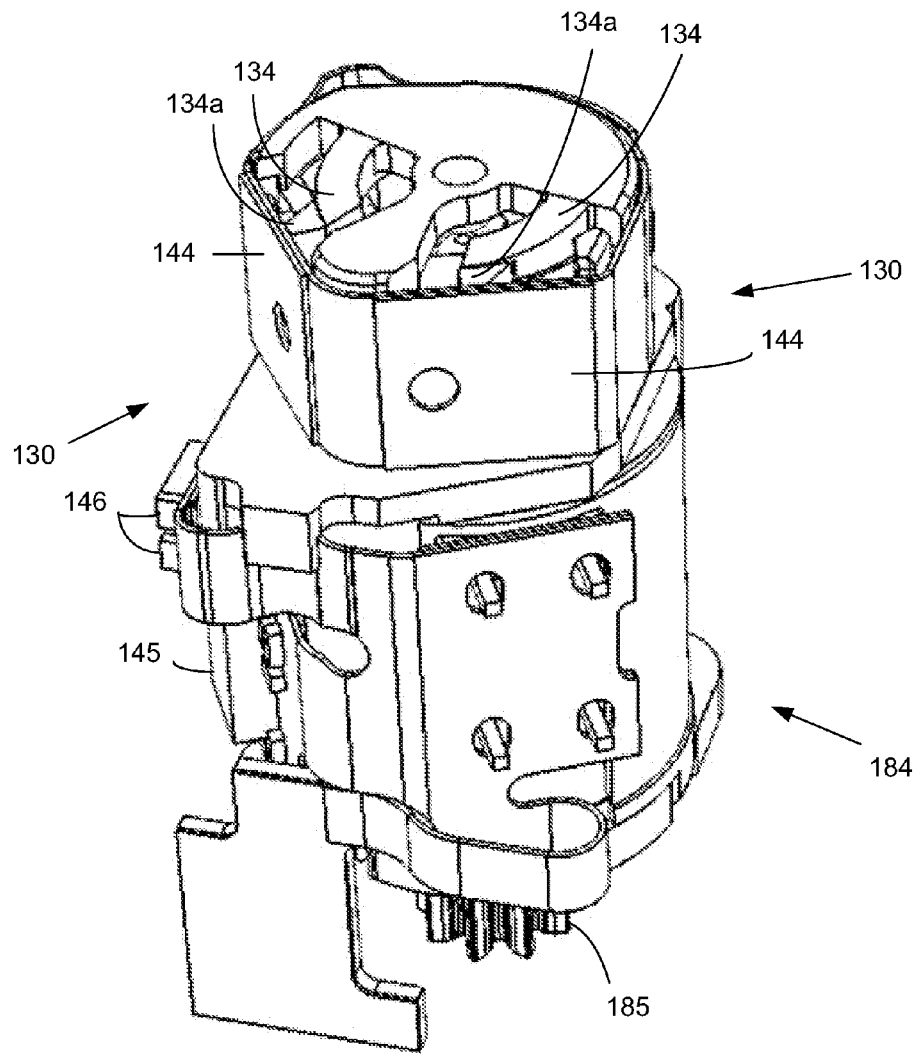
FIG. 8 illustrates a drive device of a medical device system in accordance with an embodiment of the present invention.

FIGS. 7-17 illustrate a drive device system 100 that may be employed as an embodiment of the drive device 80 discussed above in accordance with an embodiment of the present invention. Although the drive device system 100 may be similar or used with the embodiments of FIGS. 1-6C, it should be understood that the drive device system 100 may also include some or all of the same components and operate in a manner similar to that shown and described in the embodiments of FIGS. 7-17. In addition, some or all of the features shown in FIGS. 1-6C may be combined in various ways and included in the embodiments shown in FIGS. 7-17. Likewise, it should be understood that any of the features of the embodiments of FIGS. 7-17 may be combined or otherwise incorporated into any of the other embodiments of FIGS. 7-17 as well as any other embodiment herein discussed. Also, the drive device system 100 may be employed or used with other types of delivery device systems other than those described with respect to FIGS. 1-6C. With reference to FIG. 7, the drive device system 100 may include, but is not limited to, a motor 184 (or other suitable drive device), which may be similar to the motor 84 (e.g., FIGS. 1-6C), and a drive device linkage portion 182, which may be similar to the drive device linkage portion 82 (e.g., FIGS. 1-6C), and a sensor system 105.

FIGS. 8 and 10-13 illustrate a drive device (or portions thereof), such as the motor 184, of a delivery device system 100 according to an embodiment of the present invention. With reference to FIGS. 7, 8, and 10-13, the motor 184 may be controlled to drive the drive device linkage portion 182. In some embodiments, for example, the motor 184 may include a motor gear 185 supported on a rotary shaft 181 (e.g., FIG. 11). The rotary shaft 181 may be driven by the motor 184 to rotate or otherwise move the motor gear 185. Thus in some embodiments, the motor gear 185 may be arranged to operatively engage with the drive device linkage portion 182 to allow the motor 184 to drive the drive device linkage portion 182 via the motor gear 185.

In other embodiments, other mechanisms for transferring a drive force from the motor 184 to the drive device linkage portion 182, or the like may be employed in alternative of or in addition to the motor gear 185. For example, the motor 184 may include, but is not limited to, a belt, chain, pulley, or the like operatively connected with the drive device linkage portion 182 to drive the drive device linkage portion 182.

Figure 17:
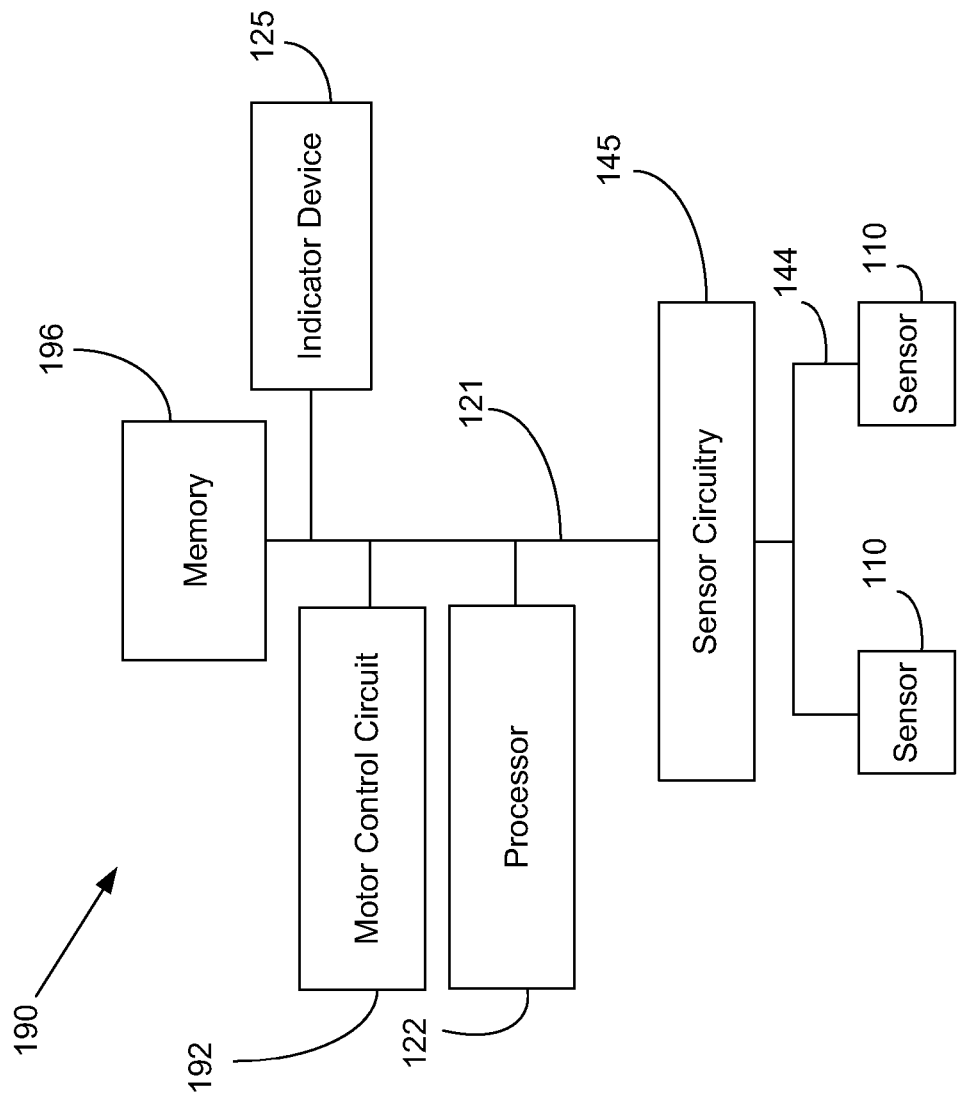
FIG. 17 illustrates a block diagram of circuitry of a medical device system in accordance with an embodiment of the present invention.

In various embodiments, the motor 184 may be provided with electrical terminals for connection to a motor control circuit 192 (e.g., FIG. 17). In some embodiments, the motor control circuit 192 may be mounted within the durable portion 22 (e.g., FIG. 1-6C) of the delivery device 12 (e.g., FIG. 1-6C) for controlling operation of the motor 184 according to a desired infusion delivery program or profile. In other embodiments, the motor control circuit 192 may be mounted in the disposable portion 20 and connectable to the electrical terminals of the motor 184 when the durable portion 22 and the disposable portion 20 are engaged and connected together.

A delivery program or profile may be stored within a suitable electronic storage medium (e.g., memory 196 in FIG. 17) located within the durable portion 22 and/or may be communicated to the delivery device 12 from other sources, such as a CCD 16 or a computer 18 (e.g., FIG. 1-6C). Alternatively or in addition, the motor control circuit 192 may control the motor 184 to deliver one or more discrete volumes of infusion media in response to delivery demand control signals generated within the delivery device 12 or communicated to the delivery device 12 from other sources, such as a CCD 16 or a computer 18. The motor 184 may be, but is not limited to, a step motor, DC motor, voice coil motor, three-phase motor, and/or the like.

The drive device linkage portion 182 may be for operatively engaging a plunger arm, such as the plunger arm 60 (e.g., FIGS. 1-6C) to allow the motor 184 to move the plunger arm and an attached plunger head, such as the plunger hear 70 (e.g., FIGS. 1-6C), to move within a reservoir, such as the reservoir system 40 (e.g., FIGS. 1-6C). Thus, in a case where the reservoir contains fluidic media and an infusion path is provided from the reservoir to the body of a user-patient, the plunger head may be moved within the reservoir to force fluidic media from the reservoir and into the infusion path to deliver fluidic media to the body of the user-patient.

Figure 10:
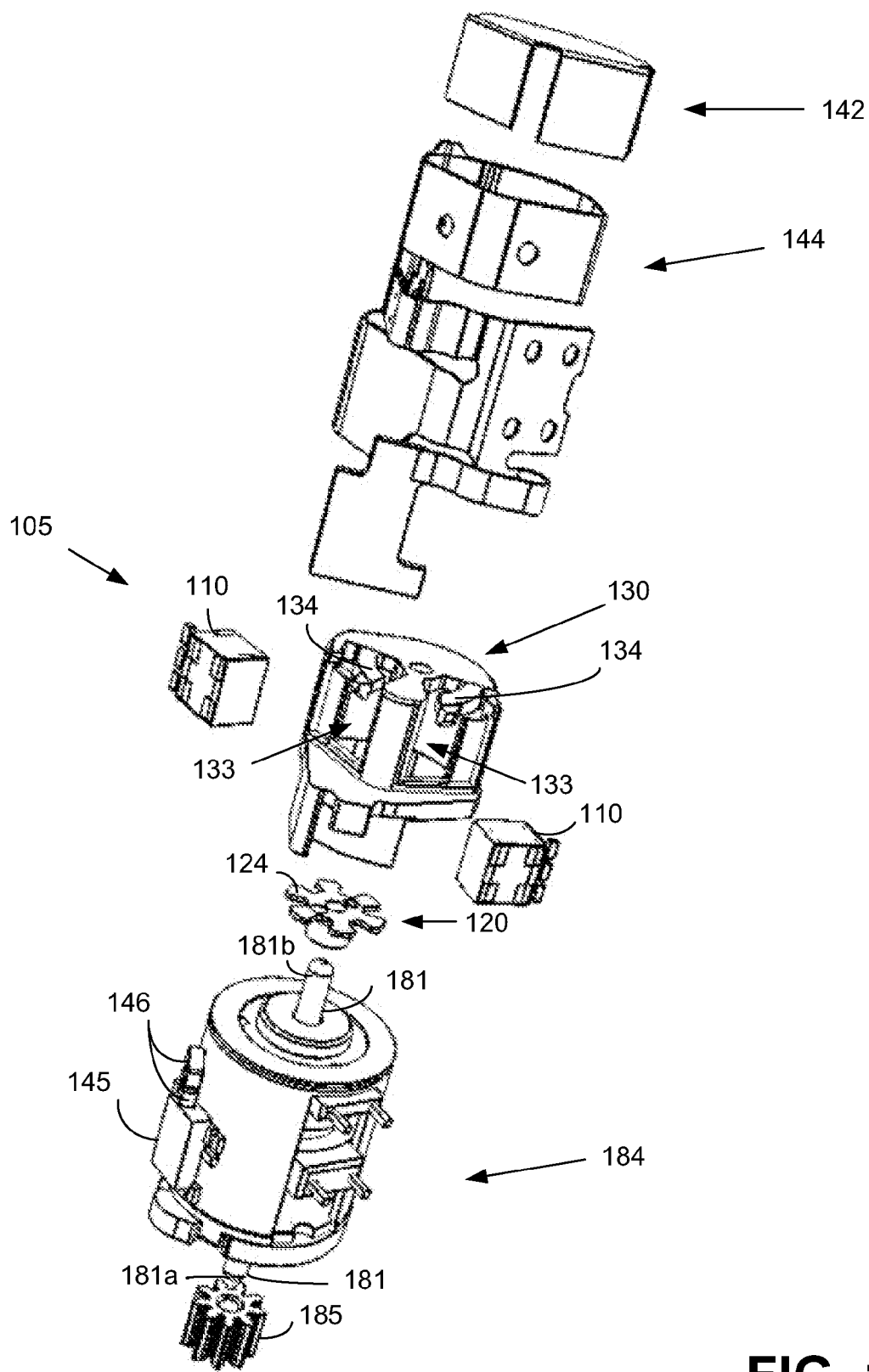
FIG. 10 illustrates an exploded view of a drive device of a medical device system in accordance with an embodiment of the present invention.
Figure 11:
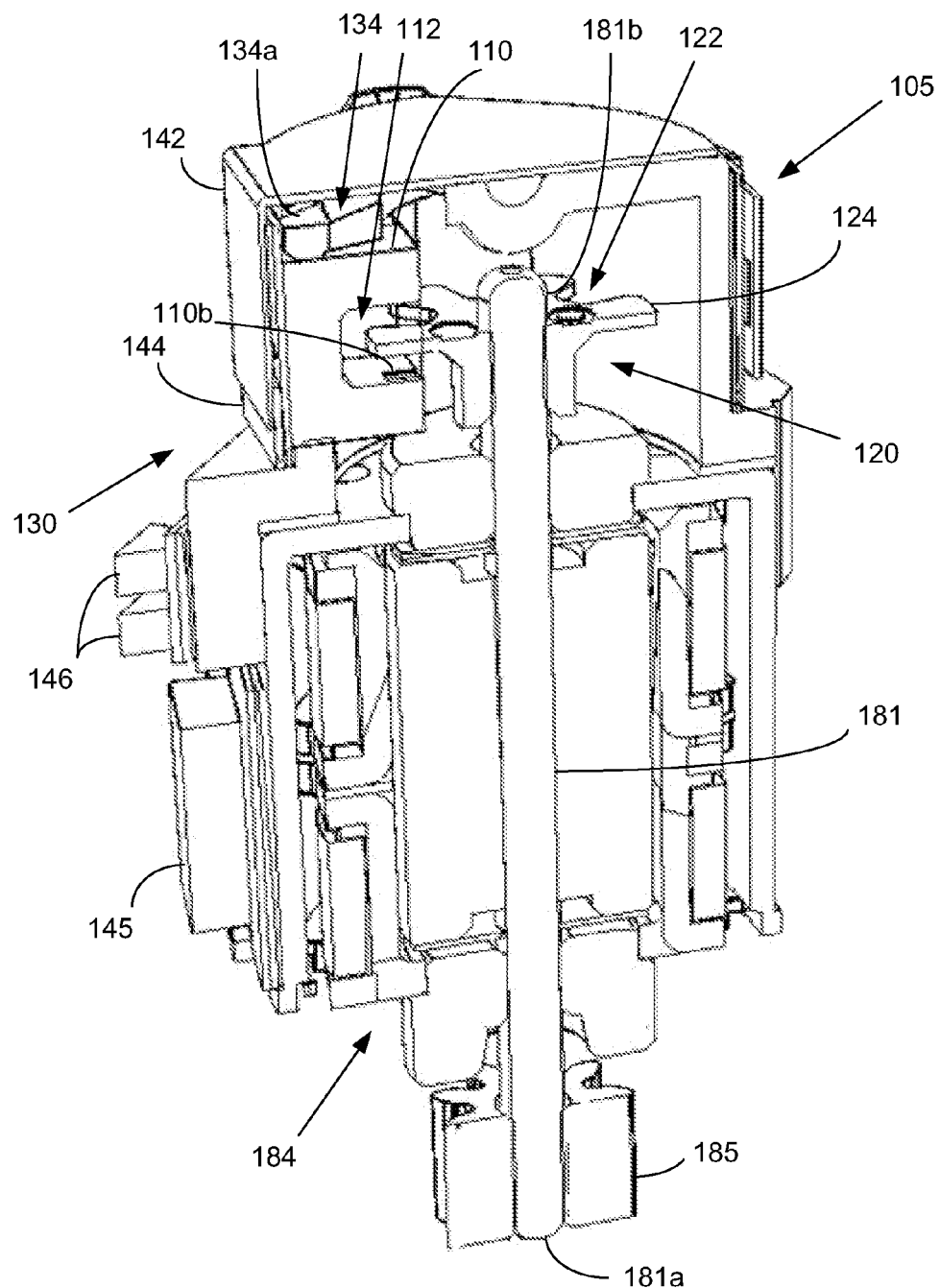
FIG. 11 illustrates a drive device of a medical device system in accordance with an embodiment of the present invention.
Figure 12:
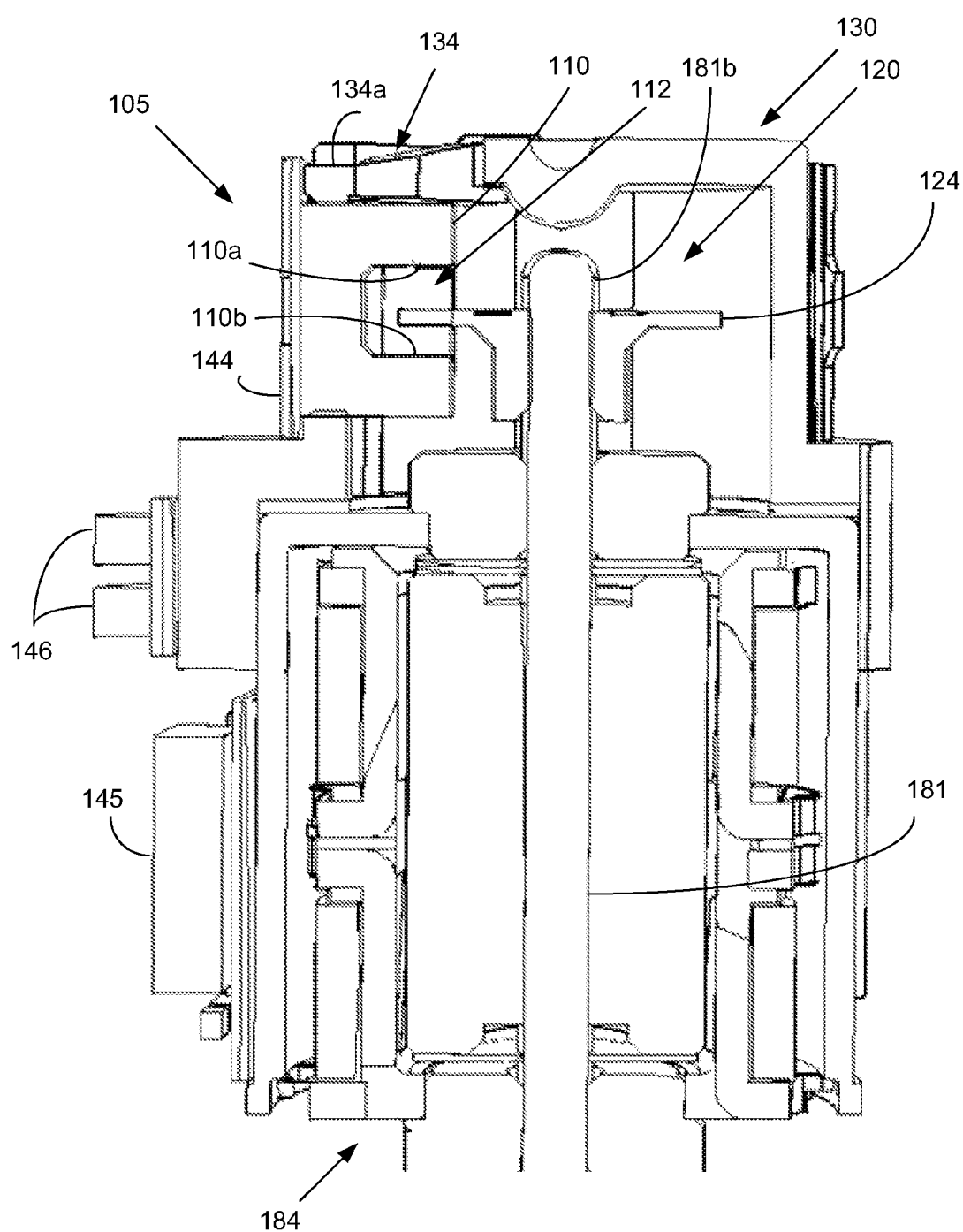
FIG. 12 illustrates a portion of a drive device of a medical device system in accordance with an embodiment of the present invention.
Figure 13:
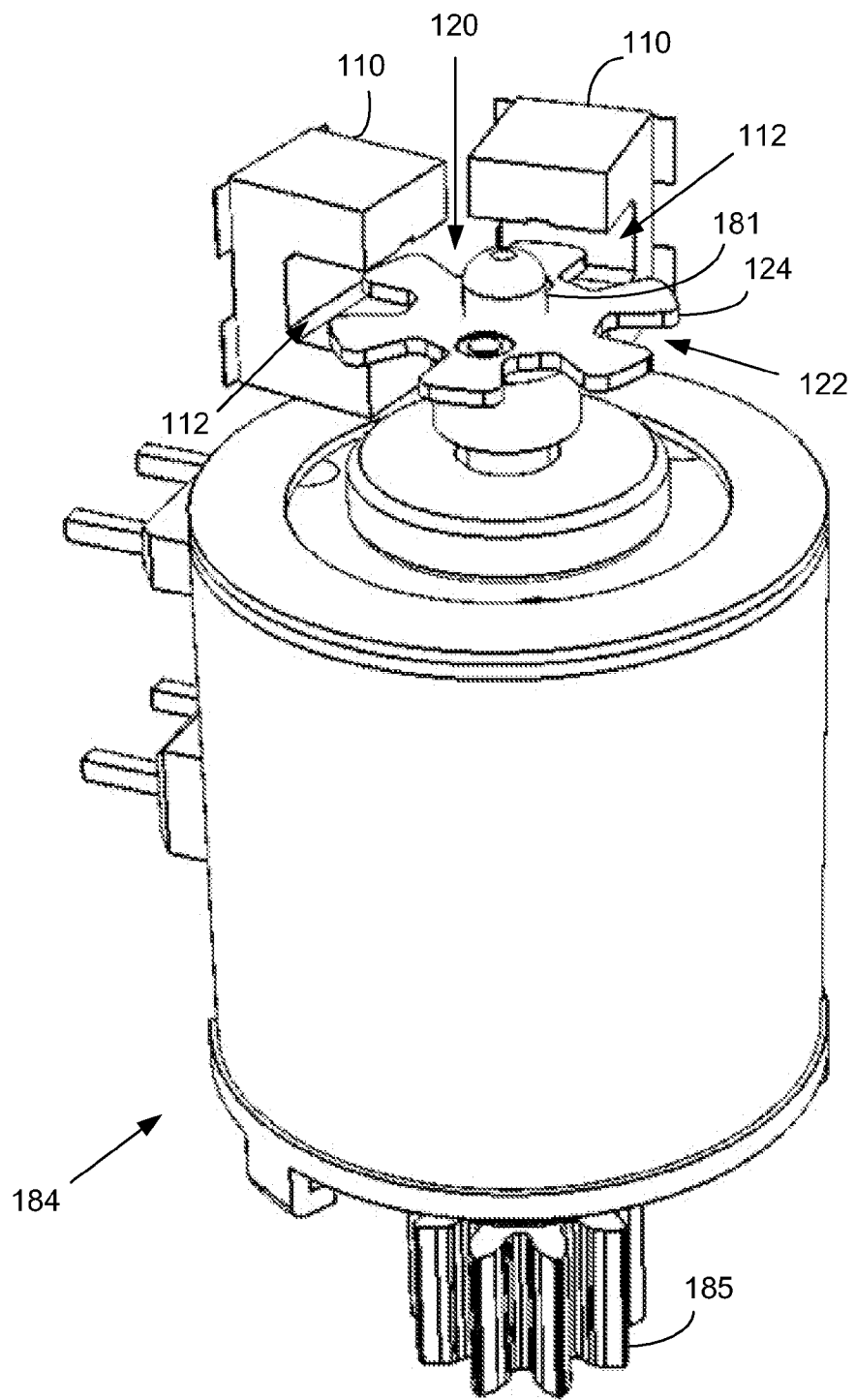
FIG. 13 illustrates a portion of a drive device of a medical device system in accordance with an embodiment of the present invention.

FIGS. 10-12 illustrate a sensor system (e.g., 105) according to an embodiment of the present invention. The sensor system 105 may include at least one sensor 110 configured to sense or otherwise determine movement of the rotary shaft 181. In some embodiments, the rotary shaft 181 may include a detectable feature measurable or otherwise detectable by the at least one sensor 110. In particular embodiments, the detectable feature may be a rotary member 120, such as a wheel 120, or the like that rotates with rotation of the rotary shaft 181, for example, by the motor 185. In such embodiments, the rotary member 120 may have axis in alignment with an axis of the rotary shaft 181. That is, the rotary member 120 and the rotary shaft 181 may have a common axis. In particular embodiments, the rotary member 120 may be supported or otherwise arranged on the rotary shaft 181 to rotate with rotation of the rotary shaft 181. In such embodiments, for example, movement (e.g., rotation) of the rotary shaft 181 and/or the motor gear 185 may closely relate to movement of the rotary member 120.

In some embodiments, the rotary member 120 may include the detectable feature. For example, the detectable feature may be supported on the rotary member 120 in a position to be detected by the at least one sensor 110. In other embodiments, the at least one sensor 110 and the detectable feature (e.g., 120) may be interchanged. For instance, the sensor 110 may be supported on the rotary member 120, and the detectable feature may be arranged to be detected by the sensor 110 as the rotary member 120 is rotated.

In other embodiments, the rotary member 120 or other detectable feature may be on a linkage portion (e.g., 182 in FIG. 7), such as a rotary shaft, operatively connected with the rotary shaft 181. In such embodiments, the rotary member 120 may have a different axis than that of the rotary shaft 181. In some embodiments, the rotary member 120 may include a plurality of arms 124 with each of the plurality of arms separated by a gap 122. In other embodiments, the rotary member 120 may include one arm (e.g., 124) extending therefrom.

In some embodiments, the rotary shaft 181 may have a first end 181a supporting the motor gear 185 and a second end 181b for supporting the rotary member 120. The rotary shaft 181 may extend through the motor 184 so that the first end 181a of the rotary shaft 181 is on one side of the motor 184 and the second end 181b of the rotary shaft 181 is on another side of the motor 184, for example, opposite the first end 181a. In other embodiments, one or both of the rotary member 120 and the motor gear 185 need not be supported on respective ends of the rotary shaft 181, but instead may be supported on the rotary shaft 181 in any manner in which the motor 184 is arranged in between the rotary member 120 and the motor gear 185. In such embodiments, for example, the motor gear 185 may be exposed on one side of the motor 184 while the rotary member 120 and associated components (e.g., the sensor 110) may be protected on the other side of the motor 184. In yet other embodiments, the rotary member 120 may be arranged on a same end as the motor gear 185.

The sensor 110 may be any suitable sensor for sensing the rotary member 120 (or other detectable feature) or movement (e.g., rotation) thereof. For example, the sensor 110 may be, but not limited to, an encoder sensor, photo interrupter, or the like. In other embodiments, the sensor 110 may be any other suitable sensor, such as (but not limited to) a magnetic sensor, optical sensor (or other light detector), tactile sensor, capacitive sensor, inductive sensor, and/or the like. In such embodiments, the rotary member 120 (and/or the detectable feature) may be selected or configured based on a type of the sensor 110 employed.

The sensor 110 may be configured to count or otherwise sense rotational steps of the motor 184, for example via the rotary member 120 (or other detectable feature) supported on the rotary shaft 181, to determine motion (e.g., clockwise and/or counter-clockwise) of the motor 184 and/or the motor gear 185, for instance, in a specified angle of rotation. For instance, in some embodiments, the sensor may be configured to count or otherwise sense the plurality of arms 124 of the rotary member 120 as the rotary member 120 is rotated. In various embodiments, movement (e.g., rotation) of the rotary member 120 may correspond to movement (e.g., rotation) of the motor gear 185. Thus, in such embodiments, sensing, detecting, or the like of the rotary member 120 may provide information relating to the motor gear 185.

In particular embodiments, the sensor 110 may be configured to count or otherwise sense rotational steps of the motor 184, for example via the rotary member 120 (or other detectable feature) supported on the rotary shaft 181, to determine motion (e.g., clockwise and/or counter-clockwise) of the motor 184 and/or the motor gear 185, for instance, in a specified angle of rotation.

In some embodiments, the sensor 110 may include an emitter 110a and a detector 110b. The emitter 110a and the detector 110b may be arranged opposite each other so that at least a portion of the rotary member 120 rotates therebetween. For example, the sensor 110 may detect each instance an arm 124 of the rotary member 120 interrupts a transmission from the emitter 110a to the detector 110b. Or for example, the sensor 110 may detect each instance a transmission from the emitter 110a to the detector 110b is completed, such as through the gaps 122 of the rotary member 120.

In other embodiments, the emitter 110a and the detector 110b may be on a same side of the sensor 110. For instance, in such embodiments, the sensor 110 and/or the rotary member 120 may be configured to sense a reflectivity of light (or other detectable characteristic, such as magnetism) from the rotary member 120 (e.g., each arm 124) as the rotary member 120 rotates. For example, as above, the sensor 110 may detect each instance an arm 124 of the rotary member 120 interrupts a reflection of the transmission from the emitter 110a to the detector 110b. Or for example, the sensor 110 may detect each instance a reflection of the transmission from the emitter 110a to the detector 110b is completed, such as through the gaps 122 of the rotary member 120.

The sensor system 100 may include any suitable number of sensors 110. In the embodiments shown in FIG. 13, two sensors 110 are provided. In other embodiments, fewer sensors 110 (e.g., one sensor) may be employed. In yet other embodiments, additional sensors 110 may be employed. Reference may be made to one sensor, at least one sensor, and/or multiple sensors interchangeably, unless specifically noted otherwise.

In some embodiments having more than one sensor 110 (e.g., FIG. 13), each of the sensors 110 may be positioned around the axis of the rotary member 120 (and/or the rotary shaft 181). For example, each of the sensors 110 may be circularly positioned around the axis of the rotary member 120 to be positioned substantially perpendicular to each other. In particular embodiments, each of the sensors 110 may be positioned relative to each other so that their signals are substantially perpendicular to each other. As such, there may be a phase shift in the signals due to the angular positioning of the sensors 110. In other embodiments, some or all of the sensors may be positioned in any suitable manner relative to the rotary member 120 (and/or the rotary shaft 181) and/or each other.

In some embodiments, the sensor 110 may include a gap 112 or slot through which the rotary member 120 may rotate. In further embodiments, the sensor 110 and the rotary member 120 may be arranged relative to each other such that the rotary member 120 may rotate through a center of the gap 112 of the sensor 110.

Figure 14:
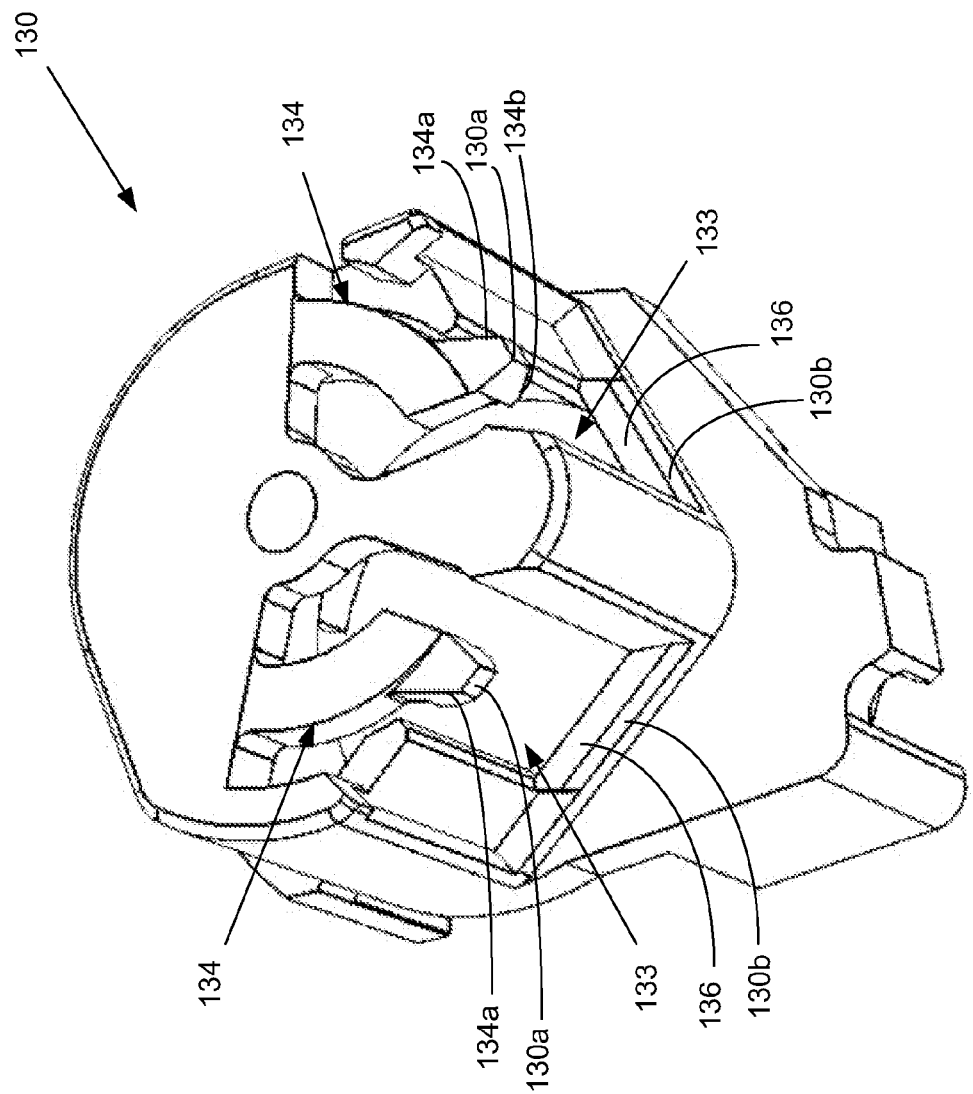
FIG. 14 illustrates a portion of a drive device of a medical device system in accordance with an embodiment of the present invention.
Figure 15:
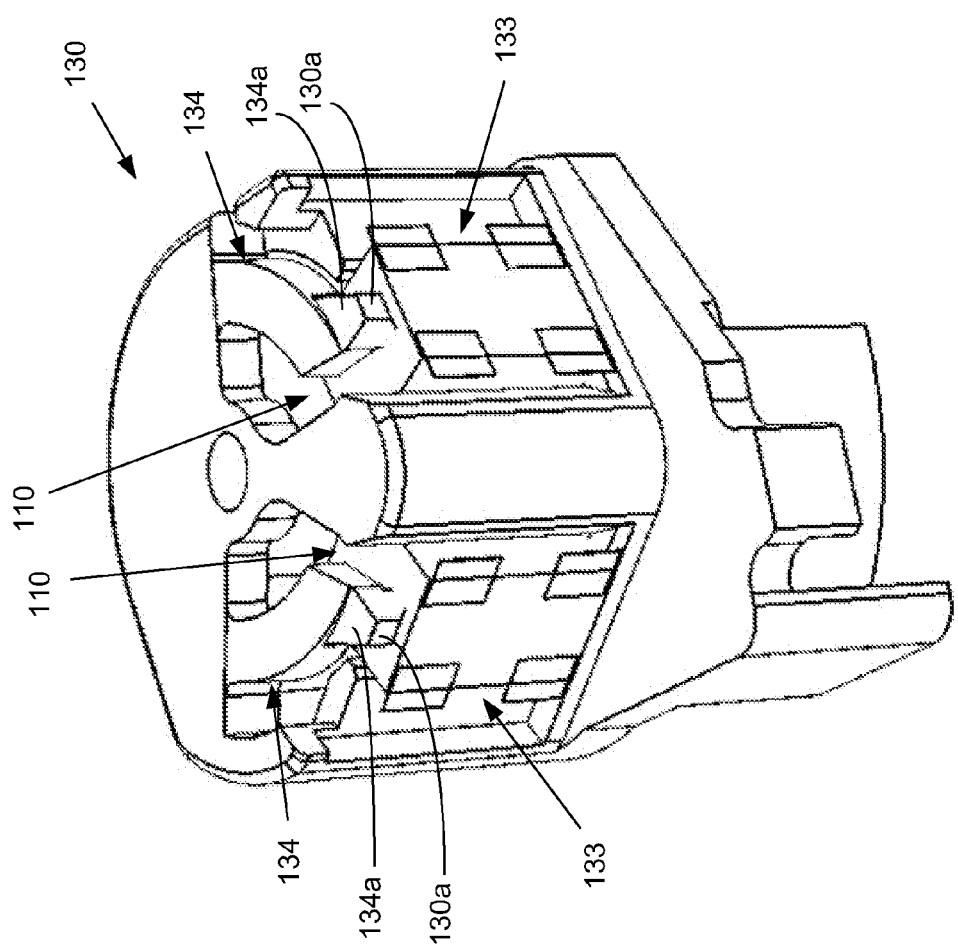
FIG. 15 illustrates a portion of a drive device of a medical device system in accordance with an embodiment of the present invention.

FIGS. 14 and 15 illustrate a frame or housing 130 in which at least one sensor (e.g., 110) may be arranged in accordance with an embodiment of the present invention. With reference to FIGS. 12 and 14-16, in various embodiments, the at least one sensor 110 and the rotary member 120 may be arranged in the housing 130. The housing 130 may configured to support the sensors 110 in any suitable manner. In particular embodiments, the housing 130 may be configured to support the sensor 110 such that the sensor 110 is aligned with the axis of the rotary shaft 181, which may share a common axis with the rotary member 120. In some embodiments, the housing 130 may include an opening 133 defined by a seating surface 136 for supporting the sensor 110. In embodiments having multiple sensors 110, the housing 130 may include multiple openings 133 each defined by a seating surface 136 for supporting the multiple sensors 110.

In particular embodiments, the housing 130 may be configured to bias (e.g., press) the sensor 110 against the seating surface 136 (and/or other suitable surface of the housing 130 and/or drive device system 100), for example, to align the sensor 110 with the axis of the rotary shaft 181. In some embodiments, the housing 130 may include a bias member, such as an arm 134 having an end 134a arranged to bias the sensor 110 against the seating surface 136 (and/or other suitable surface of the housing 130 and/or drive device system 100). In particular embodiments, the arm 134 may be rigid, yet sufficiently flexible and resilient to bias the sensor 110 against the seating surface 136. In other embodiments, the housing 130 may include other bias members, such as a spring, collapsible skirt, and/or the like, for biasing the sensor 110.

The end 134a may include a contact surface 134b for contacting the sensor 110 supported on the seating surface 136. In further embodiments, the contact surface 134b may be aligned (e.g., vertically) over the seating surface 136. In such embodiments, the sensor 110 may be supported by the housing 130 without being cantilevered, which may prevent shifting of the sensor 110, for example away from the seating surface 136. In other embodiments, the sensor 110 may be supported by the housing 130 in any suitable manner to align or retain alignment of the sensor 110 with the axis of the rotary shaft 181a (and/or rotary member 120)

In some embodiments, the end 134a may include a tab or the like for inserting into an aperture in the sensor 110 to secure the arm 134 to the sensor 110. In further embodiments, the tab may include the contact surface 134b. In other embodiments, the end 134a may include an aperture for receiving a tab or the like provided on the sensor 110 to secure the arm 134 to the sensor 110.

In various embodiments, the arm 134 and the housing 130 may be formed as a single, unitary body. In such embodiments, a unitary structure may help properly align components of the housing during assembly and/or maintain alignment after assembly. In other embodiments, the arm 134 and the housing 130 may be separate components operatively connected together.

In various embodiments, the housing 130 may be configured such that upon being connected to (or otherwise supported on) the motor 184, the at least one sensor 110 aligns with the rotary shaft 181 (and/or the rotary member 120). Such embodiments may facilitate with assembly the drive device system 100 during manufacture and/or user assembly.

FIG. 11 illustrates sensor circuitry 145 electrically connected with a sensor (e.g., 110 in FIG. 13) in accordance with an embodiment of the present invention. Thus, in various embodiments, the sensor 110 may be electrically connected with sensor circuitry 145. In various embodiments, the sensor circuitry 145 may be electrically connected to and/or include the motor control circuit (e.g., 192 in FIG. 17) and/or other circuitry (e.g., processor 122 in FIG. 17).

Figure 16:
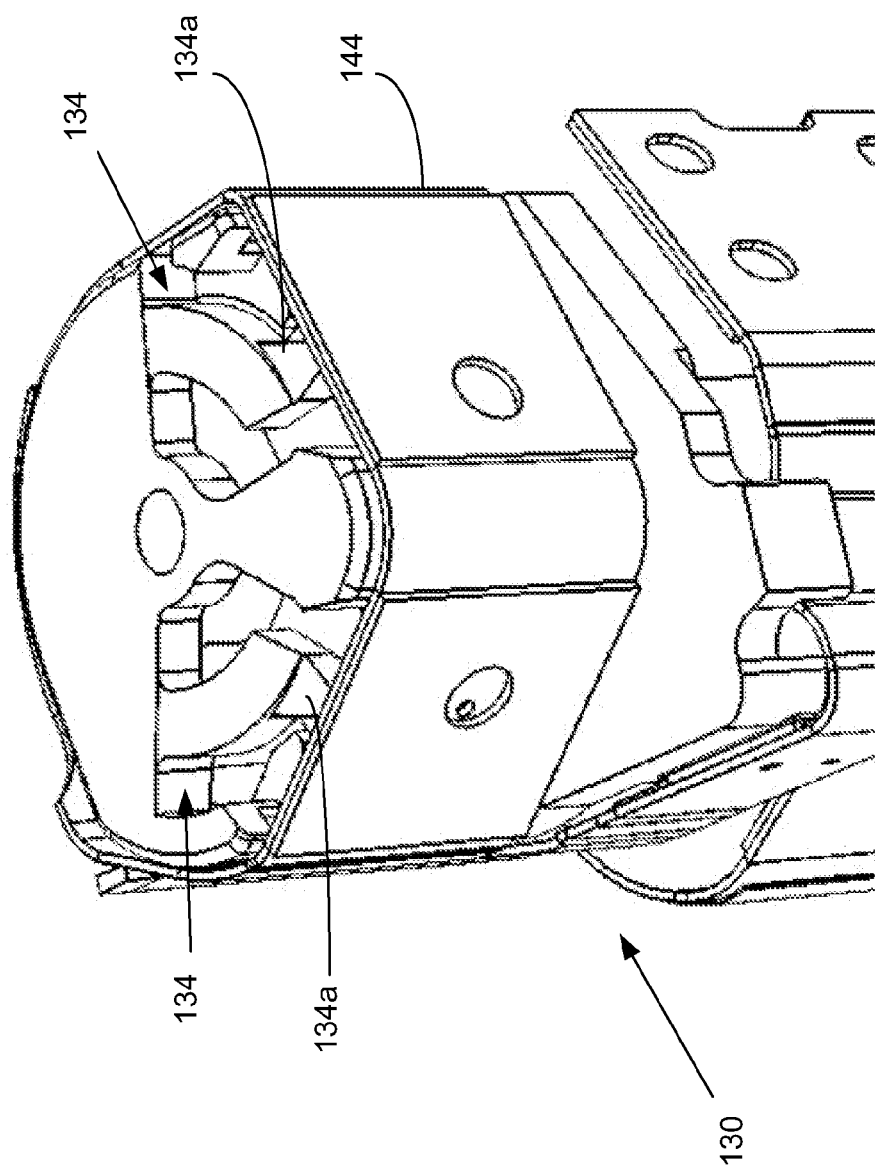
FIG. 16 illustrates a portion of a drive device of a medical device system in accordance with an embodiment of the present invention.

FIG. 16 illustrates a flexible printed circuit board (FPC) 144 for electrically connecting a sensor (e.g., 110 in FIG. 13) to sensor circuitry (e.g., 145 in FIG. 11) in accordance with an embodiment of the present invention. Thus, in various embodiments, the sensor 110 may be electrically connected to the sensor circuitry 145 via the FPC 144. In other embodiments, the sensor 110 may be electrically connected to the sensor circuitry 145 in any suitable manner.

With reference to FIGS. 11, 12, and 16, in some embodiments, the sensor 110 may be mounted to the FPC 144 using a surface mount solder technique. Thus, for example, the sensor 110 may be positioned in the seating surface 136 of the housing 130 and mounted to the FPC 144. In other embodiments, the FPC 144 may be connected to the sensor 110 in any suitable manner.

In further embodiments, the housing 130 may include a circuit board seating surface 130a, 130b for seating the FPC 144 mounted to the sensor 110. The seating surface 130a may be an end surface of the arm 134. The seating surface 130b may be an end surface (or other surface, such as part of the seating surface 136 for seating the sensor 110) of the housing 130. In other embodiments, the sensor 110 may be mounted or otherwise electrically connected with the FPC 144 in any suitable manner.

In some embodiments, at least a portion of the FPC 144 may be wrapped around at least a portion of the housing 130. In some embodiments, the FPC 144 may be adapted or otherwise configured to bias the sensor 110 toward the rotary member 120 (or other detectable feature). Thus in a case where the sensor 110 is mounted to the FPC 144 and the FPC 144 is wrapped around at least a portion of the housing 130, the FPC 144 may hold or otherwise bias the sensor 110 in position toward the rotary member 120 (or other detectable feature). For instance, by wrapping around at least a portion of the housing 130, the FPC 144 may press upon the circuit board seating surface 130a, 130b to bias or otherwise position the sensor 110 toward the rotary member 120.

In some embodiments, the FPC 144 may include, support, or otherwise be electrically connected to other components, such as the motor control circuitry 192 (e.g., 192 in FIG. 17), an indication device (e.g., 146 in FIG. 7), an occlusion detection device (not shown), such as (but not limited to) described in U.S. patent application Ser. No. 12/650,287, filed Dec. 30, 2009, entitled "Engagement and Sensing Systems and Methods, herein incorporated by reference in its entirety," a processor (e.g., 122 in FIG. 17), or the like.

Figure 9:
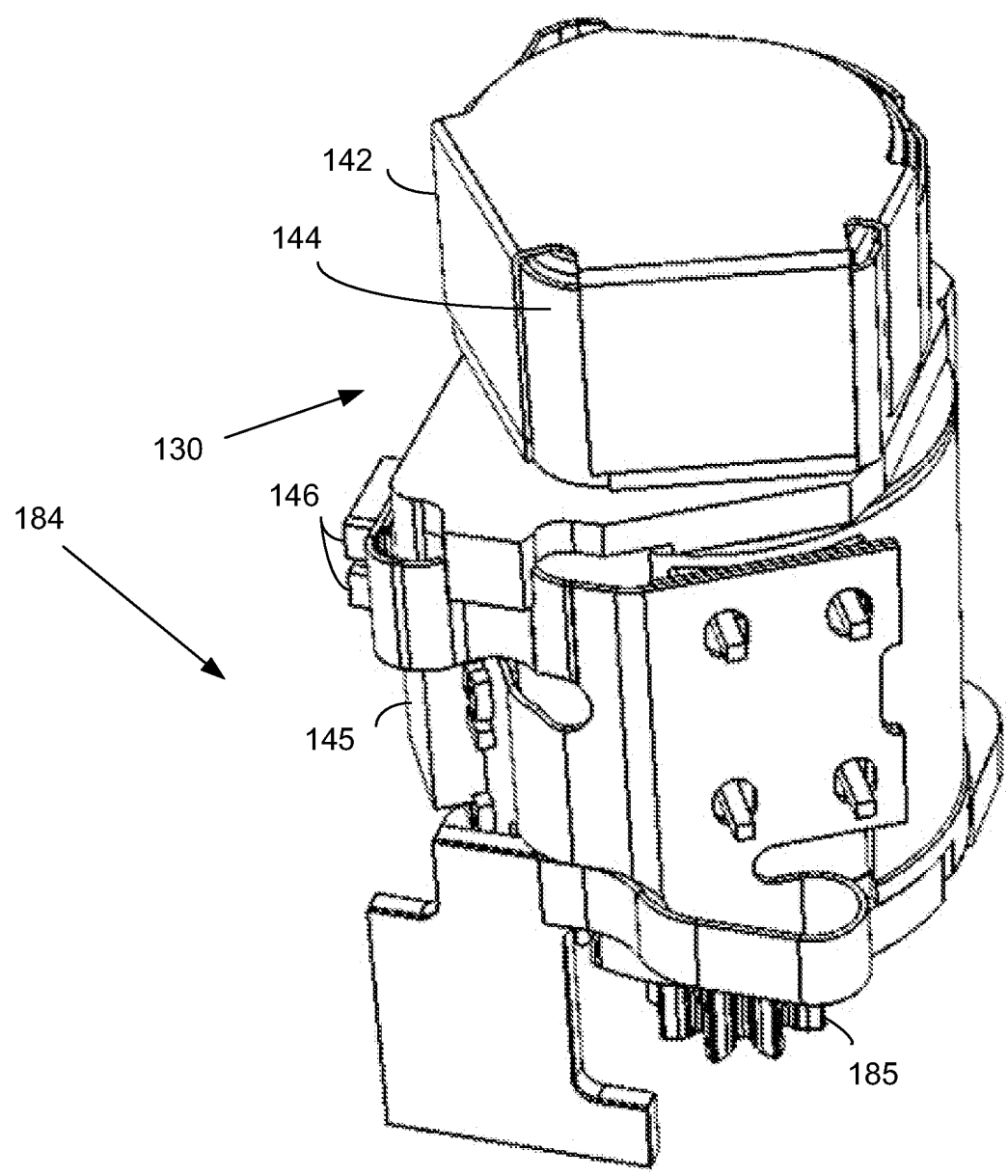
FIG. 9 illustrates a drive device of a medical device system in accordance with an embodiment of the present invention.

FIG. 9 illustrates a portion of a drive device system 100 having a shield 142 in accordance with an embodiment of the present invention. With reference to FIGS. 7 and 9-11, in some embodiments, a shield 142 may be provided around at least a portion of the housing 130 and/or the FPC 144 (and/or other circuitry). The shield 142 may be configured to prevent light from entering and/or escaping from within the housing 130. For example, the shield 142 may prevent possible light leakage toward optical light beams of the sensor 110. The shield 142 may prevent contamination of the housing 130. The shield 142 may be wrapped around at least a portion of the FPC 144 and/or other circuitry) to retain the FPC 144 in position.

In some embodiments, the shield 142 may be adapted or otherwise configured to secure the FPC 144 against the housing 140. In particular embodiments, the shield 142 may be wrapped around the at least a portion of the FPC 144 and/or the housing 130 in any suitable manner. In particular embodiments, the shield 142 may be provided with an adhesive material to allow the shield 142 to be adhered or otherwise attached to the FPC 144 (and/or other circuitry) and/or the housing 130. For example, in some embodiments, the shield 142 may comprise a tape material for wrapping around and adhering to at least a portion of the housing 130 and/or the FPC 144 (and/or other sensor circuitry 144). In various embodiments, the shield 142 may comprise a foil material, such as aluminum, tin, or the like.

FIG. 17 illustrates a block diagram of control circuitry 190 for a drive device system (e.g., 100 in FIG. 7) in accordance with an embodiment of the present invention. With reference to, FIGS. 7 and 17, in various embodiments, a processor 122 may be associated with the sensor 110, for example via bus 121. The processor 122 may be configured to execute various programs or algorithms and/or to process various information, such as data received from the sensor 110. The processor 122, for example, may be configured to compare detected signals with threshold values and/or pre-stored values in the memory 196. In other embodiments, the processor 122 may be part of the motor control circuit 192. In yet other embodiments, the processor 122 may be part of the sensor circuitry 145. In yet further embodiments, the processor 122 may be part of any suitable component.

In some embodiments, measurements from the sensor 110 may be used to control or otherwise calibrate the motor 184 and/or the motor control circuitry 192. For instance, the motor 184 may be controlled to move, for example, by the processor 122 or other circuitry until the sensor 110 measures a desired result.

In some embodiments, such as those embodiments having one or more sensors 110, each (or some) of the sensors 110 may be configured to provide different information. For example, a first sensor may be configured to measure a speed at which the rotary member 120 rotates (or otherwise detects the detectable feature), while a second sensor measures a distance between the second sensor and the rotary member 120. Accordingly, associated circuitry as described can determine that the rotary shaft 181 (and/or the motor gear 185) are functioning properly, and that the rotary shaft 181 (and/or the motor gear 185) is orientated relative to the sensors correctly (e.g., the rotary shaft 181 has not shifted during operation or installation of the drive device system 100). Each sensor or any combination thereof can be configured to provide or detect various information as needed, such as, but not limited to, acceleration of the rotary member 181, strength of the rotary member 181 (e.g., a gauss level of a magnetic rotary member 181 or other detectable feature), angular rotation of the rotary member 181, and/or the like In some embodiments, the processor 122 (or the motor control circuitry 192) may be configured to carry out certain processing based on the operating conditions (and/or malfunctions) determined by the processor 122 and/or the sensor circuitry 144. For example, the processor 122 may provide a signal to the motor 184 to stop the motor 184 from driving a plunger arm any further. In various embodiments, the processor 122 or any other component (e.g., the motor control circuitry 192) may be configured to carry out any processing associated with the drive device system 100 (e.g., a medical delivery device), for example, but not limited to, processing described in U.S. patent application Ser. No. 12/649,619, filed Dec. 30, 2009, entitled "Alignment Systems and Methods"; U.S. Pat. Pub. No. US 2006/0184154, filed Dec. 30, 2005, entitled "Methods and Apparatuses for Detecting Occlusions in an Ambulatory Infusion Pump"; U.S. Pat. Pub. No. US 2007/0191770, filed Nov. 20, 2006, entitled "Method and Apparatus for Detecting Occlusions in an Ambulatory Infusion Pump"; U.S. patent application Ser. No. 12/649,619, filed Dec. 30, 2009, entitled "Alignment Systems and Methods"; U.S. patent application Ser. No. 12/650,287, filed Dec. 30, 2009, entitled "Engagement and Sensing Systems and Methods"; and U.S. patent application Ser. No. 12/650,378, filed Dec. 30, 2009, entitled "Connection and Alignment Systems and Methods, all of which are herein incorporated by reference in their entirety.

In some embodiments, the processor 122 may provide a signal to or change a state of an indicator device 125, such as display device, or the like, to alert the user-patient of the occlusion. Examples of indicator devices may be found in, but are not limited to, U.S. patent application Ser. No. 11/759,725, entitled "Infusion Medium Delivery Device and Method with Drive Device for Driving Plunger in Reservoir"; and U.S. patent application Ser. No. 12/649,619, filed Dec. 30, 2009, entitled "Alignment Systems and Methods," both of which are herein incorporated by reference in their entirety. In some embodiments, the indicator device 125 may be or may include one or more LEDs 146 or the like.

Thus in various embodiments, a drive device system 100 may include a gear 185 (or other engagement member) that is exposed (e.g., to engage with a drive device linkage portion 182) and at least one sensor 110 that is protected, for example, from contaminants to which the gear 185 is exposed, yet able to provide an accurate measurement of the rotary shaft 181 (e.g., rotation thereof).

In various embodiments, the drive device system 100 may be employed in a medical device system, such as a delivery device for delivering fluidic media (e.g., insulin). In other embodiments, the drive device system 100 may be employed in any suitable system in which a drive device (e.g., motor) is employed.

In various embodiments, the rotary member 120 may be the detectable feature detected or otherwise sensed by the sensor 110. In other embodiments, a detectable feature may be supported on the rotary member 120. In such embodiments, for example, rotation of the rotary member 120 (e.g., by the motor 184) causes movement of the detectable feature about the axis of the drive shaft 181, and thus may be detectable by the sensor 110 as described. In yet other embodiments, a detectable feature may be positioned to be between the motor 184 and the rotary member 120. In such embodiments, for example, the detectable feature may be positioned to be sensed by the sensor 110 through the gaps 122 of the rotary member 120 as the rotary member 120 is rotated. (e.g., by the motor 184).

In various embodiments, any one or combination of the rotary shaft 181, the motor gear 185, the rotary member 120 (and/or the detectable feature), the arm 124 of the rotary member 120, the housing 130, the shield 142, or any other component may be made of any suitably rigid material, such as metal, plastic, composite materials, and/or the like. In particular embodiments, one or more of the components may be made of a material based on its intended use. For example, in a case where a sensor 110 is configured to detect reflectivity from the rotary member 120, the rotary member 120 (and/or the detectable feature) may be made of a reflective material and/or include a reflective material, or the like.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. The scope of the invention is indicated by the attached claims, rather than the embodiments. Various modifications and changes that come within the meaning and range of equivalency of the claims are intended to be within the scope of the invention.

What is claimed is:

1. A sensor system, the system comprising:
a drive shaft;
an engagement member supported on the drive shaft;
a motor configured to drive the drive shaft and the engagement member supported on the drive shaft;
a detectable feature comprising a rotary member supported on the drive shaft such that movement of the drive shaft by the motor changes a state of the detectable feature;
at least one sensor arranged to detect the state of the detectable feature;
circuitry configured to provide a signal in response to a change in the state of the detectable feature detected by the at least one sensor;
a seating surface against which the at least one sensor is retained; and
a bias member arranged to press the at least one sensor against the seating surface to retain alignment of the at least one sensor relative to the drive shaft.

2. The system of claim 1,
each of the at least one sensor having a slot;
the rotary member arranged to rotate through the slot of each respective sensor.

3. The system of claim 1, the rotary member having a plurality of arms, each of the arms separated by a gap.

4. The system of claim 1, the system further comprising:
a housing containing the seating surface, the at least one sensor and the rotary member.

5. The system of claim 1, the system further comprising:
a housing containing the seating surface, the at least one sensor and the rotary member;
the bias member comprising at least one arm member configured to bias a respective sensor of the at least one sensor against the seating surface to retain alignment of the respective sensor relative to the drive shaft.

6. The system of claim 1, the system further comprising:
a shield arranged relative to the at least one sensor to substantially prevent light from passing through the shield.

7. The system of claim 6, wherein the shield is made of a material comprising a metal foil material.

8. The system of claim 6, the system further comprising:
a housing for containing the at least one sensor and the rotary member;
the shield configured to bias the circuitry against a surface of the housing.

9. The system of claim 1, the at least one sensor comprising two or more sensors.

10. The system of claim 9, wherein each of the two or more sensors is positioned around the axis of the drive shaft and relative to each other so that signals of each sensor are substantially perpendicular to each other.

11. The system of claim 1, the system further comprising:
a housing for containing the at least one sensor and the rotary member;
wherein the engagement member is arranged to be external the housing.

12. The system of claim 1, wherein each of the at least one sensor comprises a photo interrupter sensor.

13. The system of claim 1, the engagement member of the motor configured to be operatively engageable with a plunger arm connected to a plunger head arranged for movement by the motor in an axial direction of a reservoir, the motor configured to drive fluidic media from the reservoir upon the motor being operatively engaged with the reservoir and the plunger arm being moved in the axial direction relative to the reservoir.

14. The system of claim 1, wherein the bias member comprises an arm that is sufficiently flexible and resilient to apply a bias force on a respective sensor of the at least one sensor, to force the respective sensor against the seating surface.

15. The system of claim 14, further comprising a housing containing the seating surface, wherein the arm is formed as a unitary structure with the housing.

16. The system of claim 15, wherein the housing further contains the at least one sensor and the rotary member.

17. The system of claim 1, further comprising a housing connected to the motor, the housing containing the seating surface.

18. The system of claim 17, wherein the housing further contains the at least one sensor and the rotary member.

19. The system of claim 18, wherein the bias member comprises an arm integral with or connected to the housing, the arm being sufficiently flexible and resilient to apply a bias force on the at least one sensor, to force the at least one sensor against the seating surface.

20. The system of claim 1, further comprising a flexible circuit board electrically connected to the at least one sensor, the flexible circuit board being configured to bias the sensor toward the rotary member.

21. The system of claim 1, wherein the at least one sensor is arranged between the seating surface and the bias member.

22. A sensor system, the system comprising:
 a drive shaft;
 an engagement member supported on the drive shaft;
 a motor configured to drive the drive shaft and the engagement member supported on the drive shaft;
 a detectable feature comprising a rotary member supported on the drive shaft such that movement of the drive shaft by the motor changes a state of the detectable feature;
 at least one sensor arranged to detect the state of the detectable feature;
 circuitry configured to provide a signal in response to a change in the state of the detectable feature detected by the at least one sensor; and
 a housing for containing the at least one sensor and the rotary member, the housing having at least one arm member configured to bias a respective sensor of the at least one sensor against a surface of the housing to retain alignment of the at least one sensor relative to the drive shaft.

23. A method of making a sensor system, the method comprising:
 providing a drive shaft;
 supporting an engagement member on the drive shaft;
 configuring a motor to drive the drive shaft and the engagement member supported on the drive shaft;
 providing a detectable feature comprising a rotary member supported on the drive shaft such that movement of the drive shaft by the motor changes a state of the detectable feature;
 arranging at least one sensor to detect the state of the detectable feature;
 configuring circuitry to provide a signal in response to a change in the state of the detectable feature detected by the at least one sensor;
 providing a seating surface against which the at least one sensor is retained; and
 arranging a bias member to press the at least one sensor against the seating surface to retain alignment of the at least one sensor relative to the drive shaft.

\* \* \* \* \*